(12) United States Patent
Huang

(10) Patent No.: US 11,678,480 B2
(45) Date of Patent: Jun. 13, 2023

(54) METHOD FOR FABRICATING SEMICONDUCTOR DEVICE WITH POROUS DECOUPLING FEATURES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 31 days.

(21) Appl. No.: 17/537,955

(22) Filed: Nov. 30, 2021

(65) Prior Publication Data
US 2022/0093609 A1    Mar. 24, 2022

Related U.S. Application Data

(62) Division of application No. 16/885,825, filed on May 28, 2020, now Pat. No. 11,296,092.

(51) Int. Cl.
*H10B 12/00* (2023.01)
*H01L 21/768* (2006.01)
*H01L 23/532* (2006.01)

(52) U.S. Cl.
CPC ....... *H10B 12/485* (2023.02); *H01L 21/7682* (2013.01); *H01L 23/5329* (2013.01); *H10B 12/053* (2023.02); *H10B 12/34* (2023.02); *H01L 2221/1047* (2013.01)

(58) Field of Classification Search
CPC .... H10B 12/053; H10B 12/34; H10B 12/485; H01L 21/7682; H01L 23/53292; H01L 2221/1047
USPC .................................................. 438/409, 960
See application file for complete search history.

(56) References Cited

U.S. PATENT DOCUMENTS 5,494,858 A * 2/1996 Gnade ............... H01L 21/02362
                                                    438/782
2009/0072402 A1* 3/2009 Jang ................... H01L 23/53295
                                                    438/669

* cited by examiner

*Primary Examiner* — Hoai V Pham
(74) *Attorney, Agent, or Firm* — Xuan Zhang

(57) ABSTRACT

The present application discloses a method for fabricating the semiconductor device with the porous decoupling features. The method includes providing a substrate; integrally forming a first conductive line and a bottom contact on the substrate; integrally forming a first conductive line spacer on a sidewall of the first conductive line and a bottom contact spacer on a sidewall of the bottom contact; and forming a porous insulating layer between the first conductive line spacer and the bottom contact spacer.

18 Claims, 40 Drawing Sheets

US 11,678,480 B2

METHOD FOR FABRICATING SEMICONDUCTOR DEVICE WITH POROUS DECOUPLING FEATURES

CROSS-REFERENCE TO RELATED APPLICATION

This application is a divisional application of U.S. Non-Provisional application Ser. No. 16/885,825 filed on May 28, 2020, which is incorporated herein by reference in its entirety.

TECHNICAL FIELD

The present disclosure relates to a semiconductor device and a method for fabricating the semiconductor device, and more particularly, to a semiconductor device with porous decoupling features and the method for fabricating the semiconductor device with the porous decoupling features.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device comprises: a substrate; a first conductive line positioned on the substrate and extend along a first direction; a first conductive line spacer positioned on a sidewall of the first conductive line; a bottom contact positioned adjacent to the first conductive line; a bottom contact spacer positioned on a sidewall of the bottom contact; and a porous insulating layer positioned between the first conductive line spacer and the bottom contact spacer; wherein a porosity of the porous insulating layer is between about 25% and about 100%.

In some embodiments, a distance between the first conductive line spacer and the bottom contact spacer is less than one-fourth of a line width of the first conductive line.

In some embodiments, a sum of a thickness of the first conductive line spacer and a thickness of the bottom contact spacer is equal to or greater than one-half of a distance between the first conductive line and the bottom contact.

In some embodiments, the semiconductor device further comprises two impurity regions respectively correspondingly positioned below the first conductive line and the bottom contact, the two impurity regions are formed of silicon phosphide, phosphorus-doped silicon carbon, silicon carbide, silicon germanium, silicon-germanium-tin alloy, or silicon-germanium-boron alloy.

In some embodiments, the semiconductor device further comprises a word line structure positioned between the two impurity regions.

In some embodiments, each of the two impurity regions comprises an upper portion positioned adjacent to the word line structure and a lower portion positioned below the upper portion and the upper portion has a tapering cross-sectional profile.

In some embodiments, the upper portion of each of the two impurity regions comprises a top surface substantially coplanar with a top surface of the substrate and two tapering sidewalls connected to the top surface and an angle between one of the two tapering sidewalls and the top surface is between about 45 degree and about 60 degree.

In some embodiments, a thickness of the upper portion of each of the two impurity regions is equal to or less than one-fifth of a thickness of each of the two impurity regions.

In some embodiments, the word line structure comprises a word line dielectric layer contacting the lower portion of the impurity region, a word line electrode positioned on the word line dielectric layer, and a word line capping layer positioned on the word line electrode.

In some embodiments, the word line dielectric layer has a thickness between about 10 angstroms and about 30 angstroms.

In some embodiments, the bottom contact comprises a bottom contact barrier layer and a bottom contact conductive layer positioned on the bottom contact barrier layer, the bottom contact spacer is positioned on a sidewall of the bottom contact barrier layer and a sidewall of the bottom contact conductive layer.

In some embodiments, the bottom contact barrier layer is a stacked layer comprising a bottom layer formed of titanium and a top layer formed of titanium nitride.

In some embodiments, the bottom contact conductive layer is a stacked layer comprising a bottom layer formed of tungsten nitride and a top layer formed of tungsten.

In some embodiments, the semiconductor device further comprises a second conductive line positioned above the bottom contact and extend along a second direction different from the first direction.

In some embodiments, the semiconductor device further comprises a top contact positioned between the bottom contact and the second conductive line.

In some embodiments, the top contact comprises a first conductive layer positioned on the bottom contact, a second conductive layer positioned on the first conductive layer, and a third conductive layer positioned on the second conductive layer.

In some embodiments, the first conductive layer is formed of doped polysilicon, the second conductive layer is formed of metal silicide and has a thickness between about 2 nm and about 20 nm, and the third conductive layer is formed of metal or metal nitride.

In some embodiments, the porous insulating layer is positioned on a sidewall of the first conductive line spacer and a sidewall of the bottom contact spacer.

Another aspect of the present disclosure provides a method for fabricating a semiconductor device. The method comprising: providing a substrate; integrally forming a first conductive line and a bottom contact on the substrate; integrally forming a first conductive line spacer on a sidewall of the first conductive line and a bottom contact spacer on a sidewall of the bottom contact; and forming a porous insulating layer between the first conductive line spacer and the bottom contact spacer.

In some embodiments, the method further comprises a step of forming two impurity regions in the substrate and below the first conductive line and the bottom contact, wherein the two impurity regions are formed of silicon phosphide, phosphorus-doped silicon carbon, silicon carbide, silicon germanium, silicon-germanium-tin alloy, or silicon-germanium-boron alloy.

Due to the design of the semiconductor device of the present disclosure, the parasitic capacitance between conductive feature such as the first conductive line and the two bottom contacts may be reduced by the alleviation feature like the plurality of air gaps or the porous insulating layer. Therefore, the performance of the semiconductor device may be improved. In addition, the upper portions of the plurality of impurity regions having tapering cross-sectional profile may provide an extra process tolerance for formation of contact thereon. Hence, the yield of fabrication of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
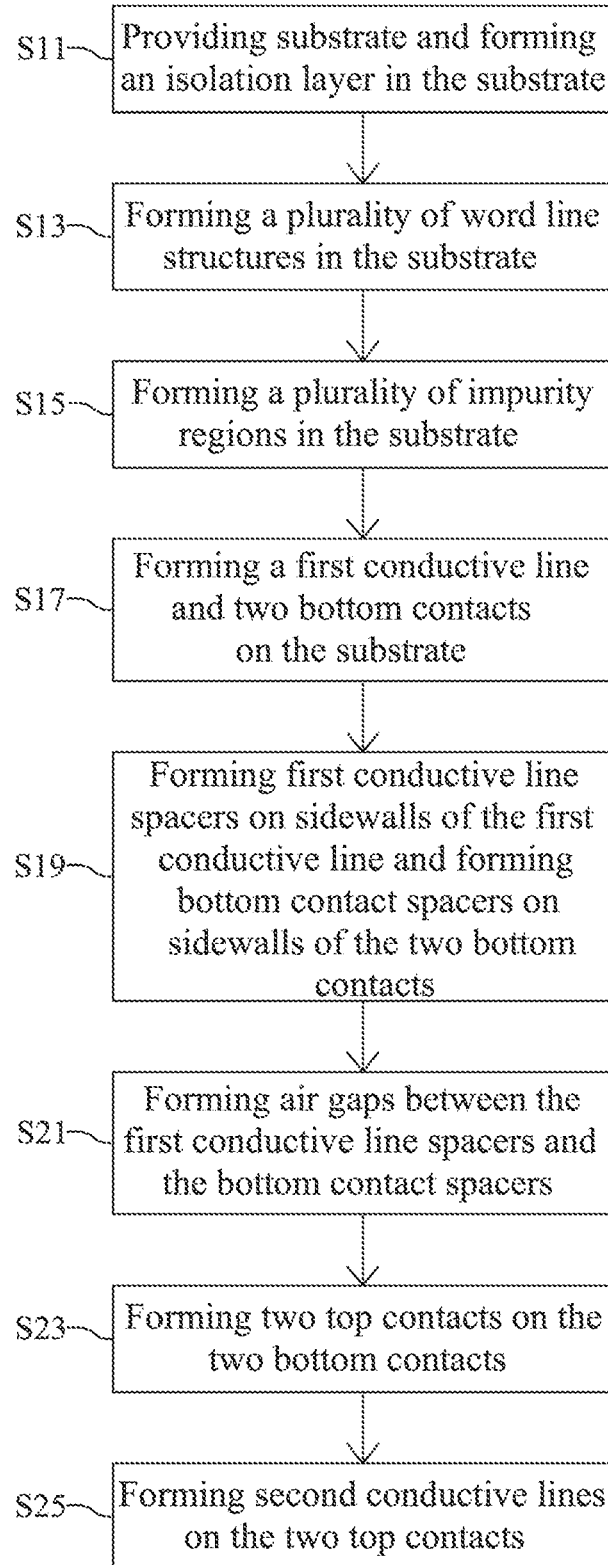
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 2:
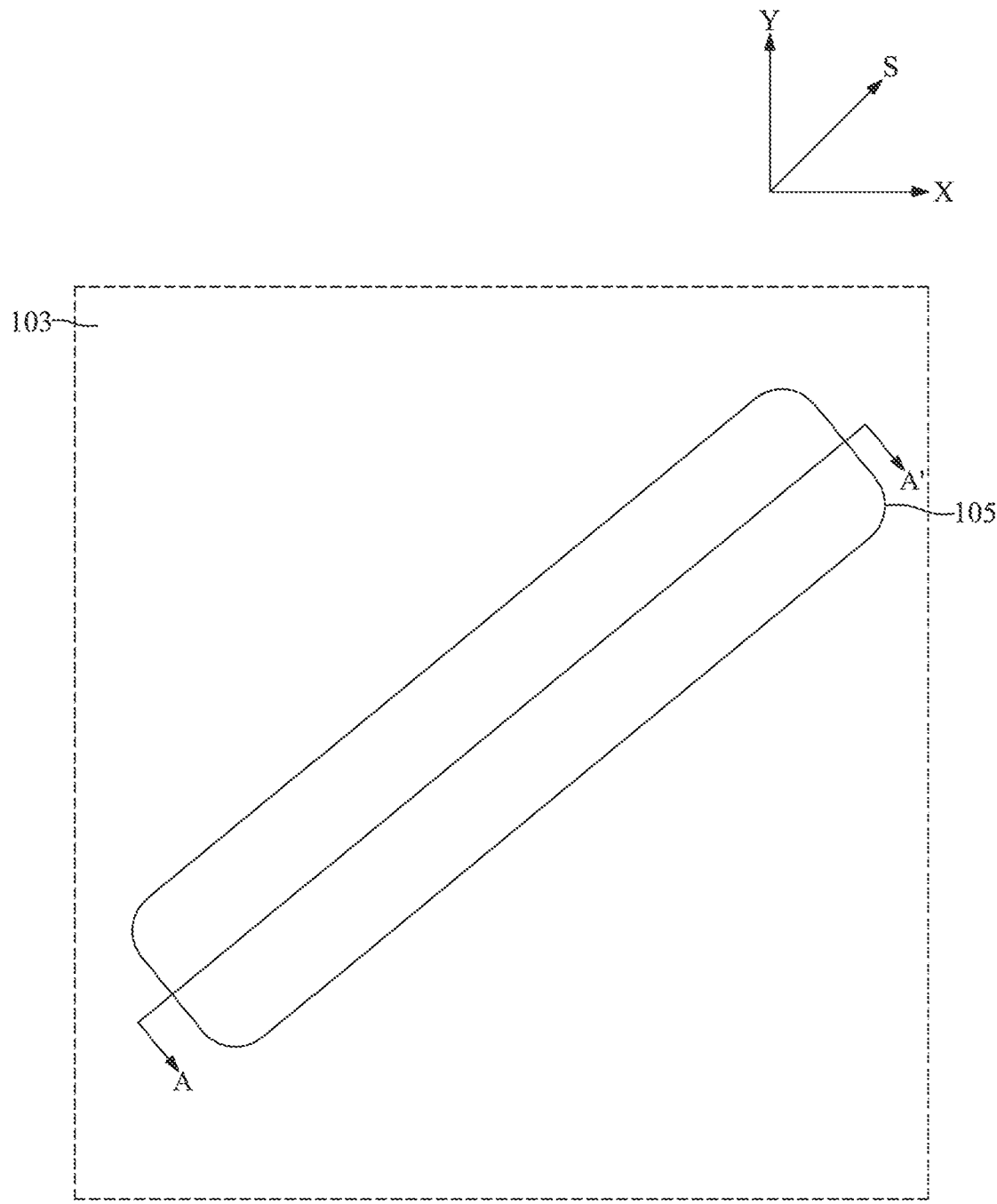
FIG. 2 illustrates, in a schematic top-view diagram, an intermediate semiconductor device in accordance with one embodiment of the present disclosure.
Figure 3:
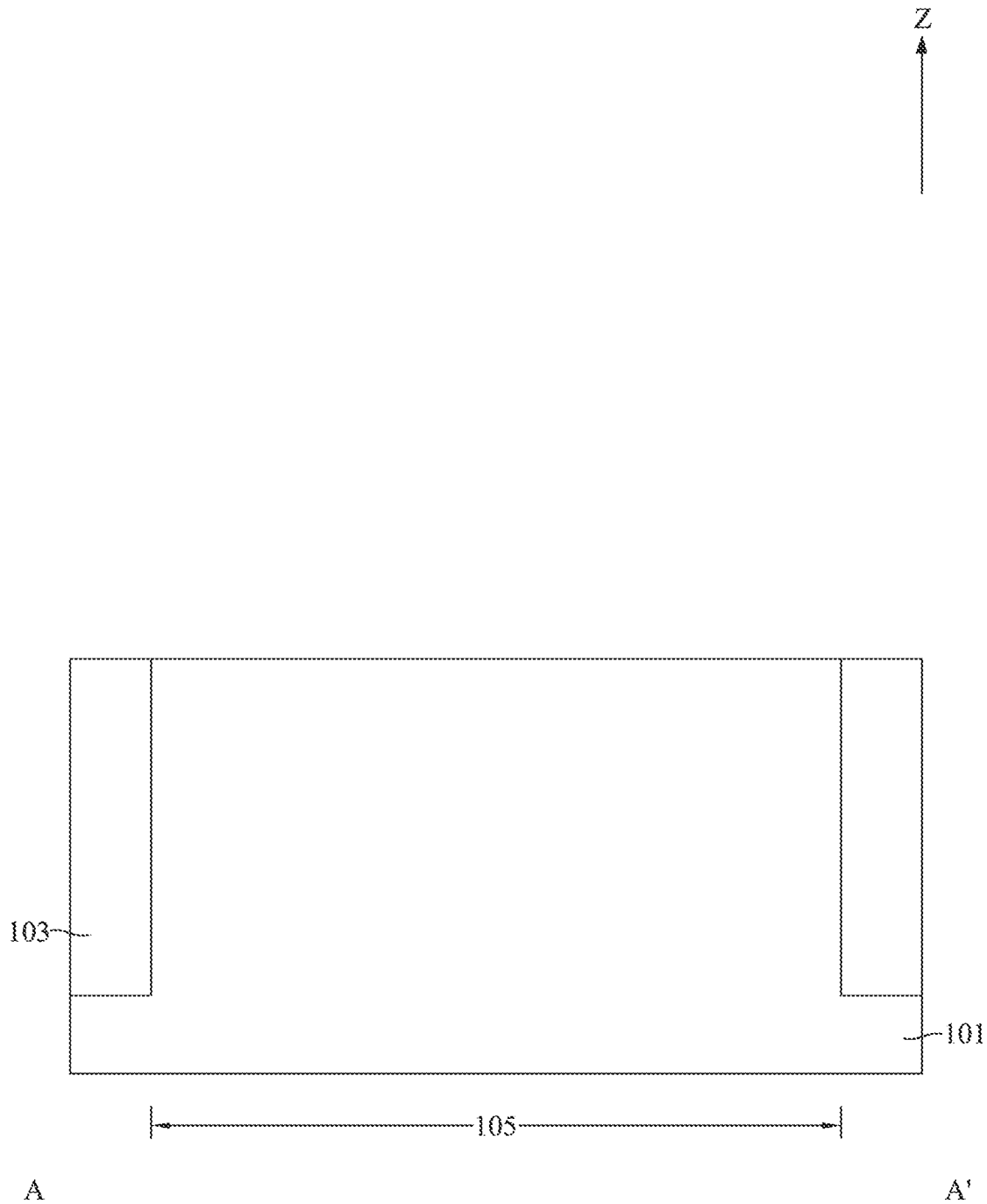
FIG. 3 is a schematic cross-sectional view diagram taken along a line A-A' in FIG. 1 illustrating part of a flow for fabricating the semiconductor device in accordance with one embodiment of the present disclosure.

FIG. 1 illustrates, in a flowchart diagram form, a method 10 for fabricating a semiconductor device 100A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 1 illustrating part of a flow for fabricating the semiconductor device 100A in accordance with one embodiment of the present disclosure.

With reference to FIGS. 1 to 3, at step S11, a substrate 101 may be provided and an isolation layer 103 may be formed in the substrate 101.

The substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. The substrate 101 may have a first lattice constant. In some embodiments, the substrate 101 may include an organic semiconductor or a layered semiconductor such as silicon/silicon germanium, silicon-on-insulator or silicon germanium-on-insulator.

The isolation layer 103 may be formed of, for example, an insulating material such as silicon oxide, silicon nitride, silicon oxynitride, silicon nitride oxide, or fluoride-doped silicate. The isolation layer 103 may define an active area 105 of the substrate 101. The active area 105 may be extended along a direction S in a top-view perspective. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen. In some embodiments, the active area 105 may be extended along a direction X in a top-view perspective.

Figure 4:
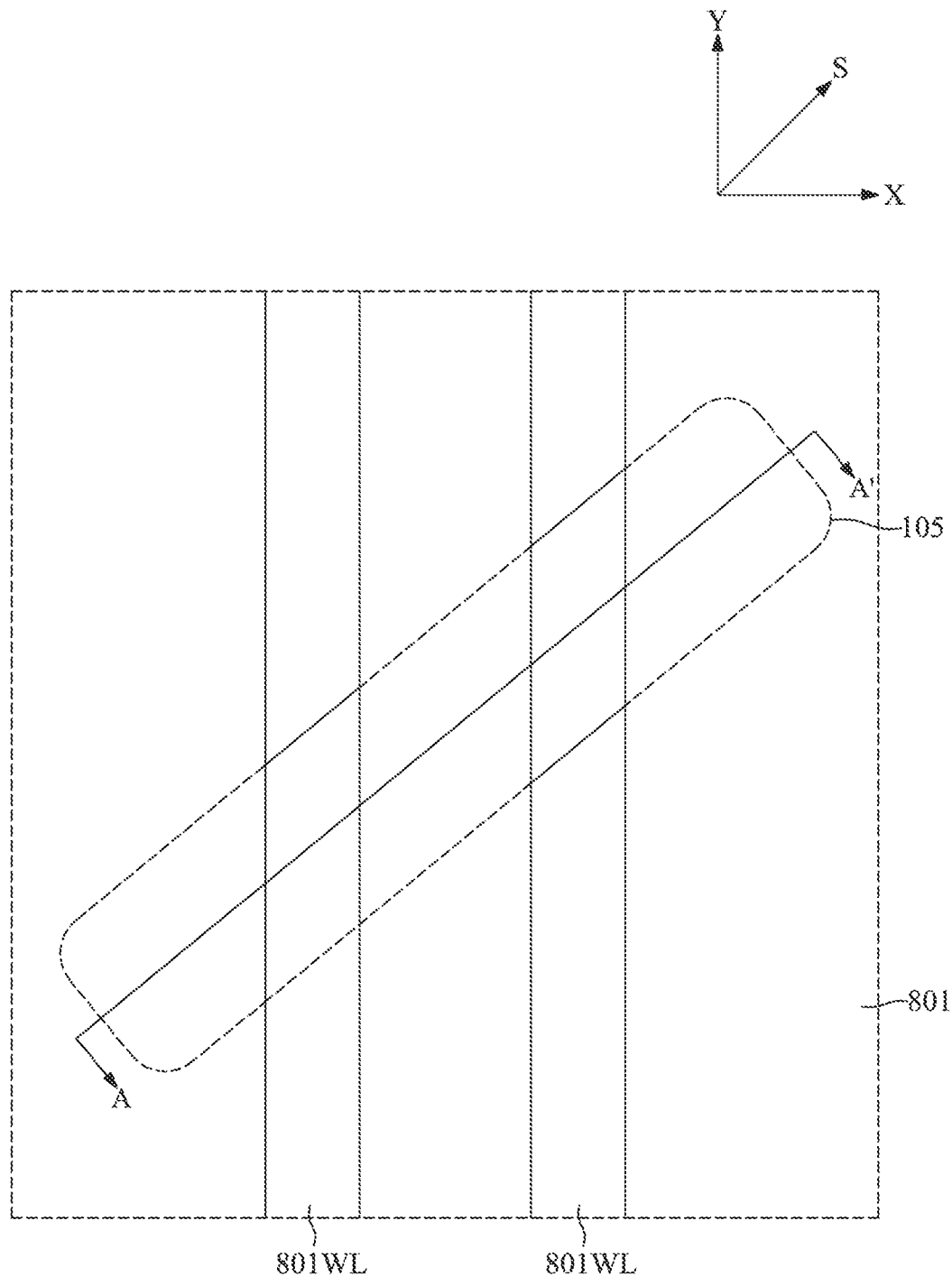
FIG. 4 illustrates, in a schematic top-view diagram, an intermediate semiconductor device in accordance with one embodiment of the present disclosure.

FIG. 4 illustrates, in a schematic top-view diagram, an intermediate semiconductor device in accordance with one embodiment of the present disclosure. FIGS. 5 to 14 are schematic cross-sectional view diagrams taken along the line A-A' in FIG. 4 illustrating part of the flow for fabricating the semiconductor device 100A in accordance with one embodiment of the present disclosure.

With reference to FIG. 1 and FIGS. 4 to 11, at step S13, a plurality of word line structures 301 may be formed in the substrate 101.

Figure 5:
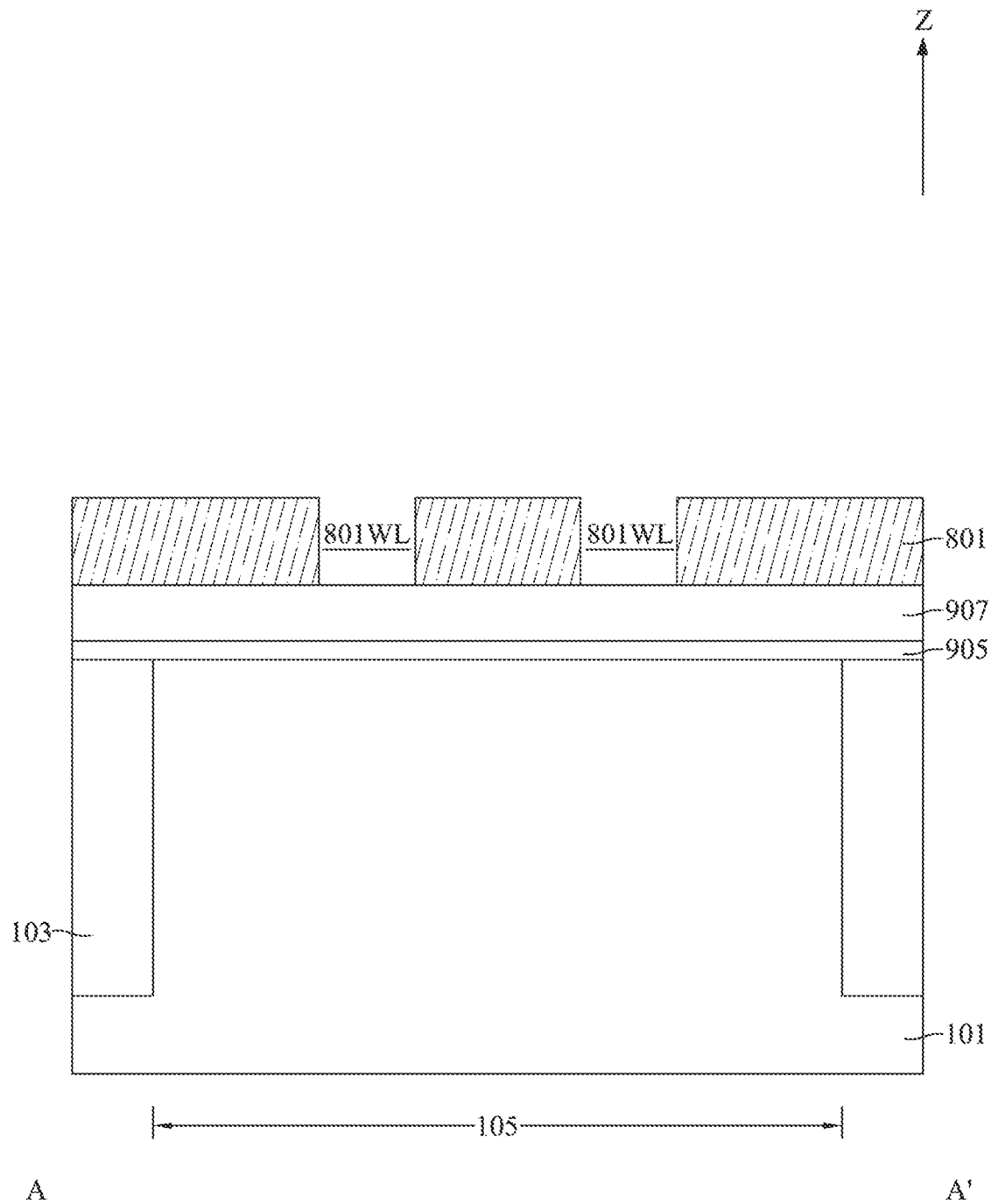
FIGS. 5 to 14 are schematic cross-sectional view diagrams taken along the line A-A' in FIG. 4 illustrating part of the flow for fabricating the semiconductor device in accordance with one embodiment of the present disclosure.

With reference to FIGS. 4 and 5, a pad oxide layer 905, a pad nitride layer 907, and a first mask layer 801 may be sequentially formed on the substrate 101. The pad oxide layer 905 may be formed, for example, silicon oxide. The pad nitride layer 907 may be formed of, for example, silicon nitride. The first mask layer 801 may include a plurality of openings 801WL. For convenience of description, only two adjacent openings 801WL are described. In a top-view perspective, the two openings 801WL may respectively extended along a direction Y and parallel to each other. The direction Y may be slanted with respective to the direction S. The two openings 801WL may intersect with the active area 105. The openings 801WL may define positions of the plurality of word line structures 301 as will be fabricated later.

Figure 6:
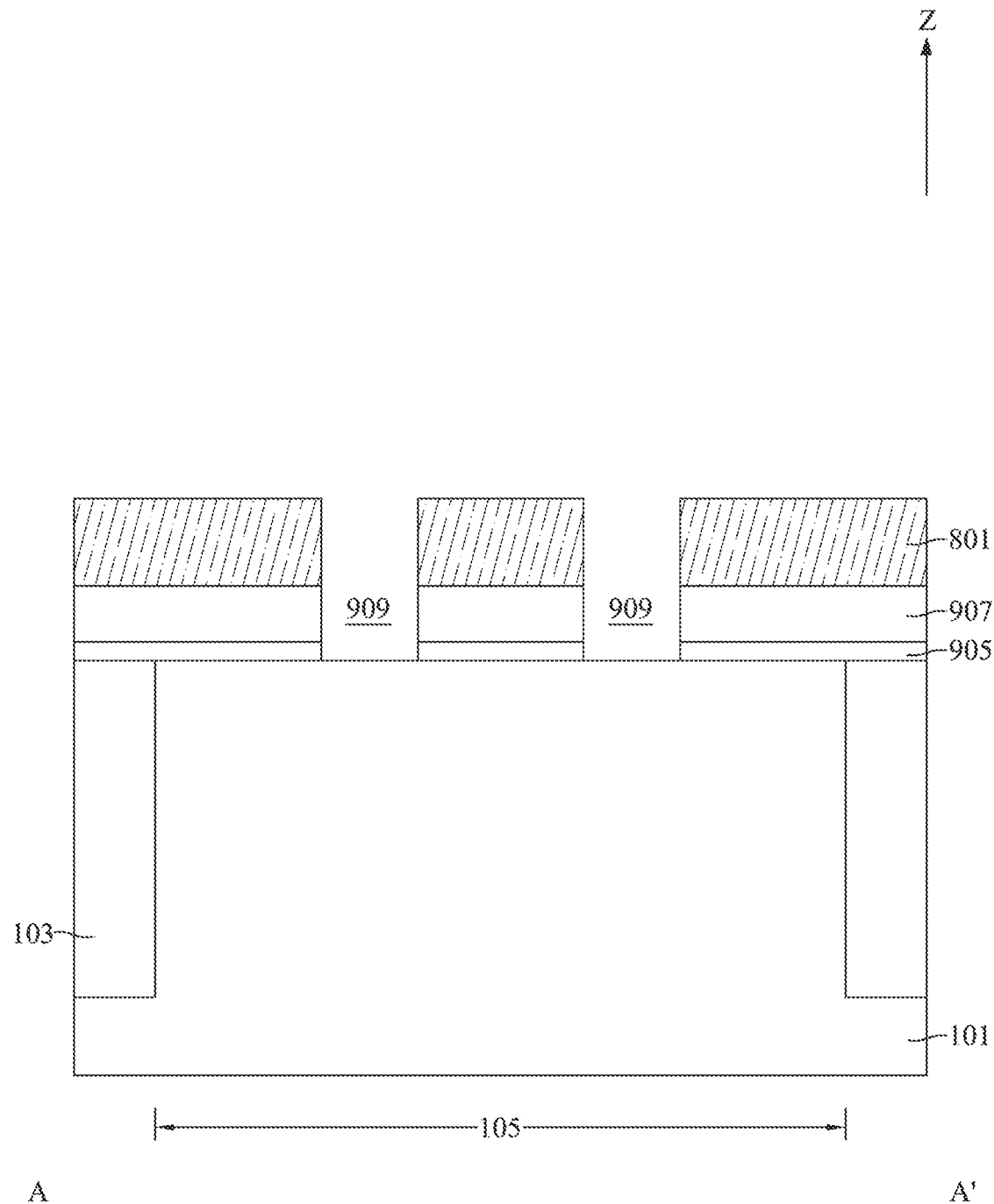

With reference to FIG. 6, a first etch process may be performed to remove portions of the pad oxide layer 905 and portions of the pad nitride layer 907 and integrally form a plurality of first openings 909. The plurality of first openings 909 may be expanded from the openings 801WL through the first etch process.

Figure 7:
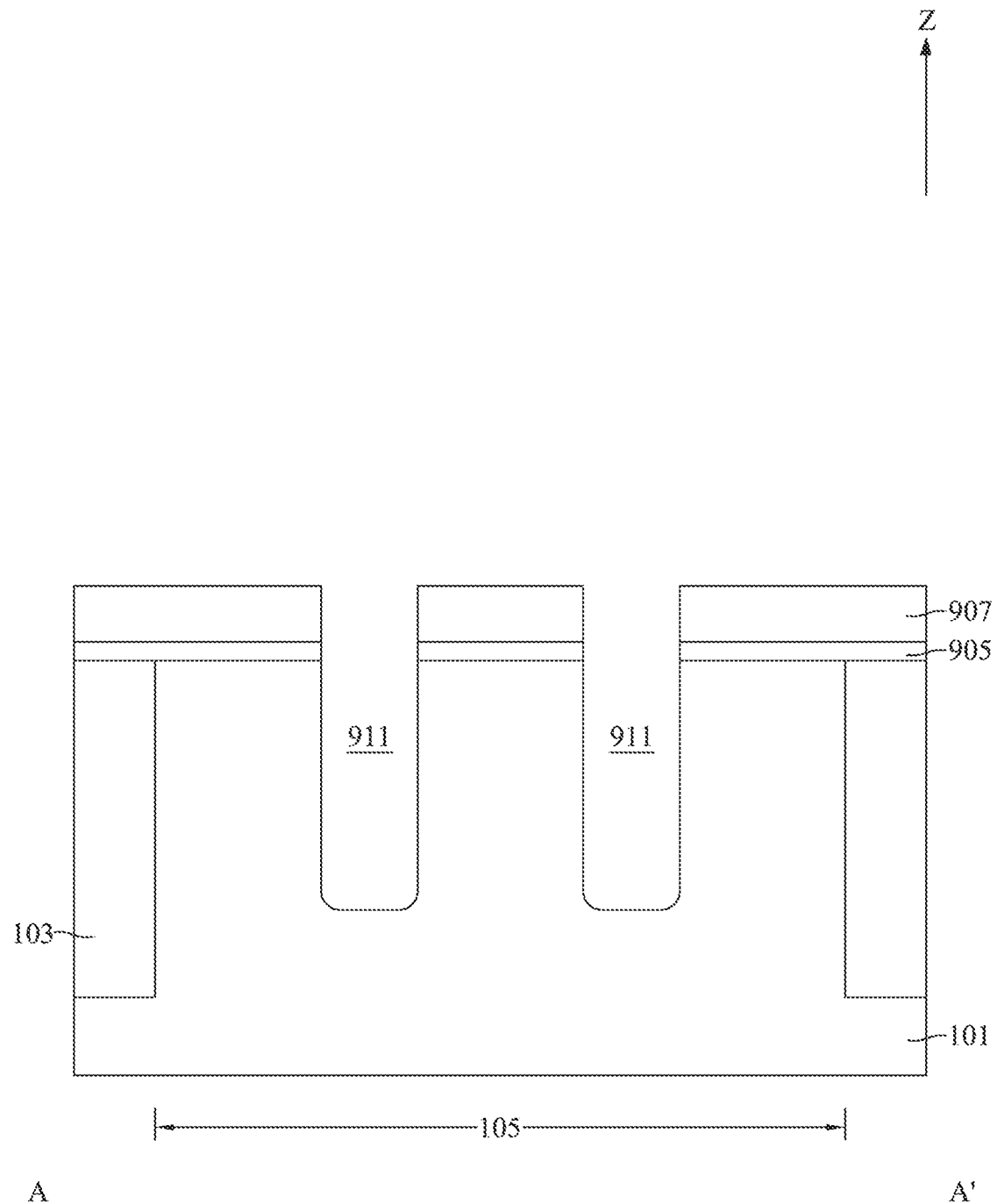

With reference to FIG. 7, a second etch process may be performed to remove portions of the substrate 101 and integrally form a plurality of word line trenches 911. The plurality of word line trenches 911 may be expanded from the plurality of first openings 909 through the second etch process. For convenience of description, only one word line trench 911 is described. After the second etch process, the first mask layer 801 may be removed. In some embodiments, the first mask layer 801 may be removed before the second etch process.

Figure 8:
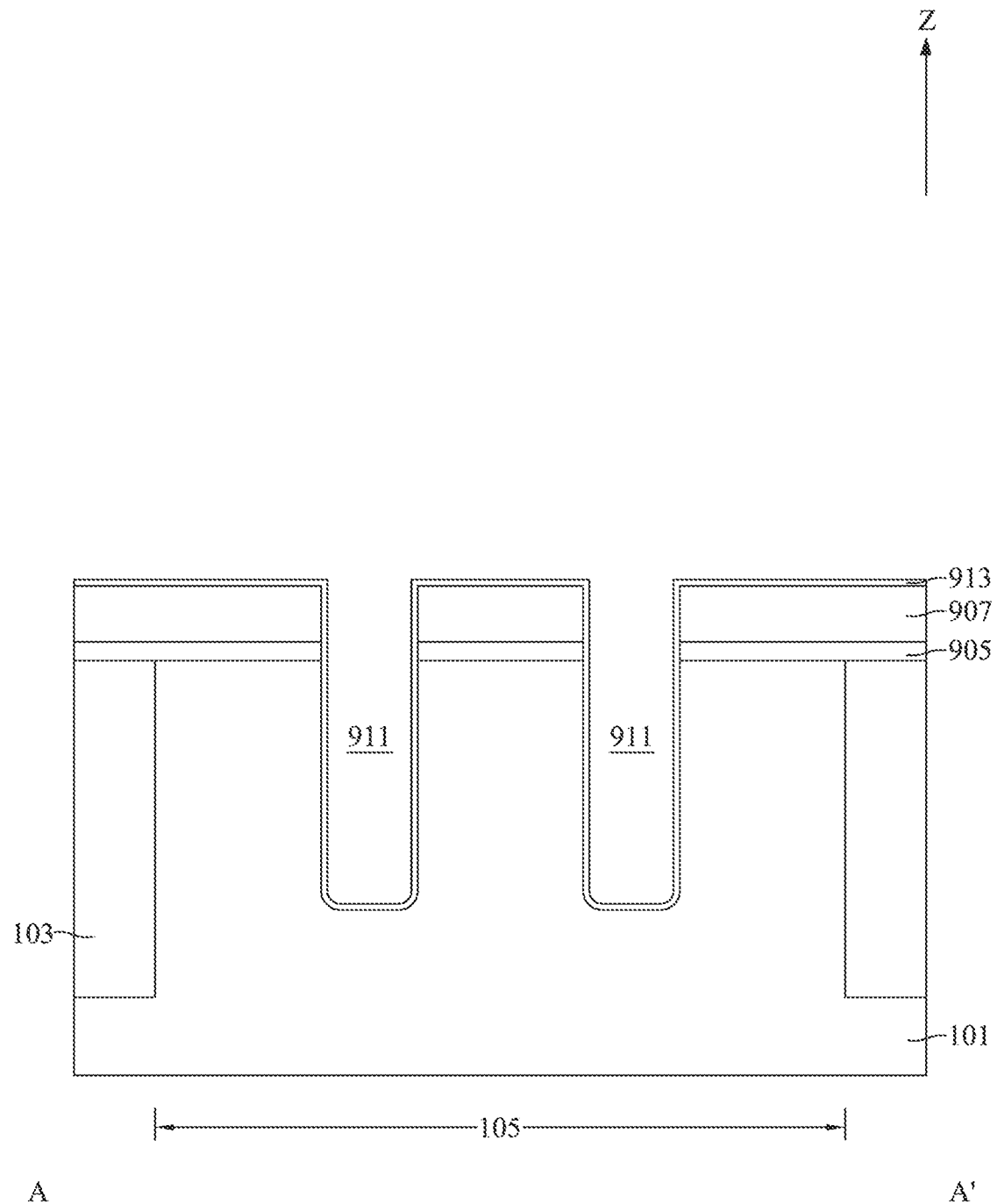

With reference to FIG. 8, a layer of first insulating material 913 may be formed on the top surface of the pad nitride layer 907 and in the word line trench 911. In some embodiments, the first insulating material 913 may be, for example, silicon oxide. In some embodiments, the first insulating material 913 may be, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the first insulating material 913 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

Figure 9:
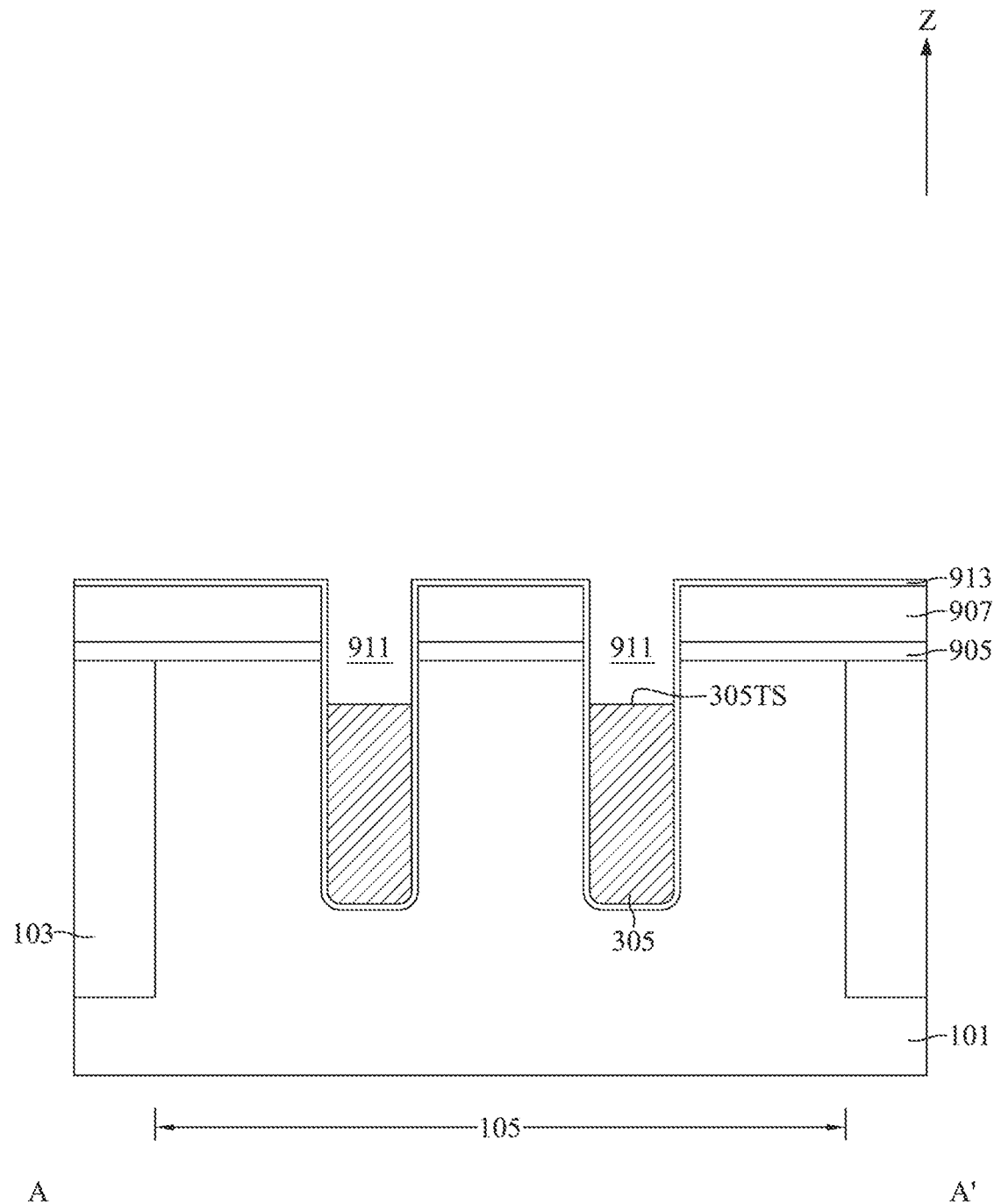

With reference to FIG. 9, a word line electrode 305 (for convenience of description, only one word line electrode 305 is described) may be formed in the word line trench 911 and on the layer of first insulating material 913. The word line electrode 305 may be formed of, for example, a conductive material such as polysilicon, silicon germanium, metal, metal alloy, metal silicide, metal nitride, metal carbide, or a combination including multilayers thereof. The metal may be, for example, aluminum, copper, tungsten, or cobalt. The metal silicide may be, for example, nickel silicide, platinum silicide, titanium silicide, molybdenum silicide, cobalt silicide, tantalum silicide, tungsten silicide, or the like. In some embodiments, the word line electrode 305 may be formed by depositing the conductive material in the word line trench 911 and applying an etch back process to remove extra conductive material.

Figure 10:
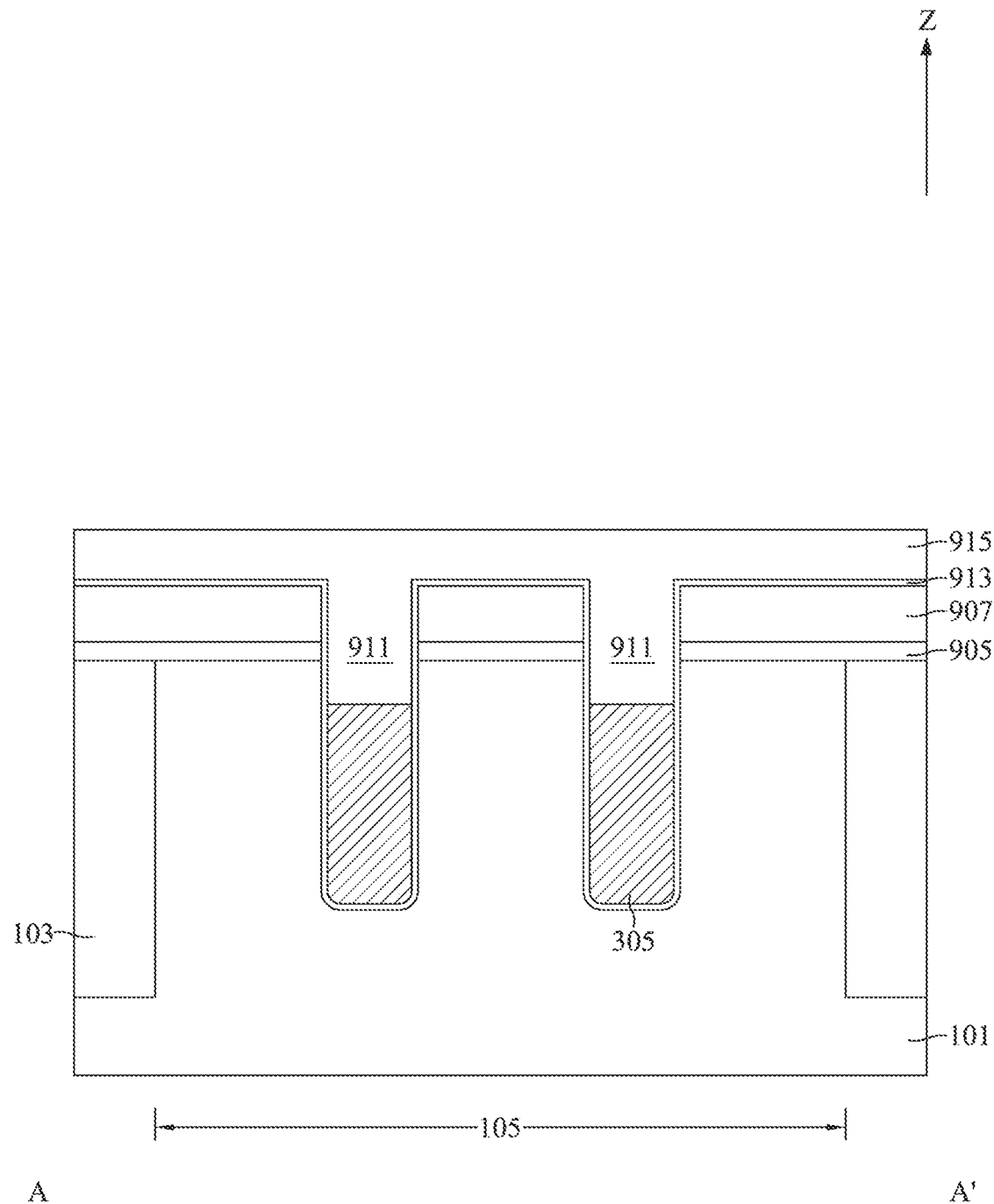

With reference to FIG. 10, a layer of second insulating material 915 may be formed on the top surface of the layer of first insulating material 913 and in the word line trench 911. The word line trench 911 may be completely filled by the layer of second insulating material 915. The second insulating material 915 may be formed of, for example, silicon oxide, a high-k dielectric material, or a combination thereof.

Figure 11:
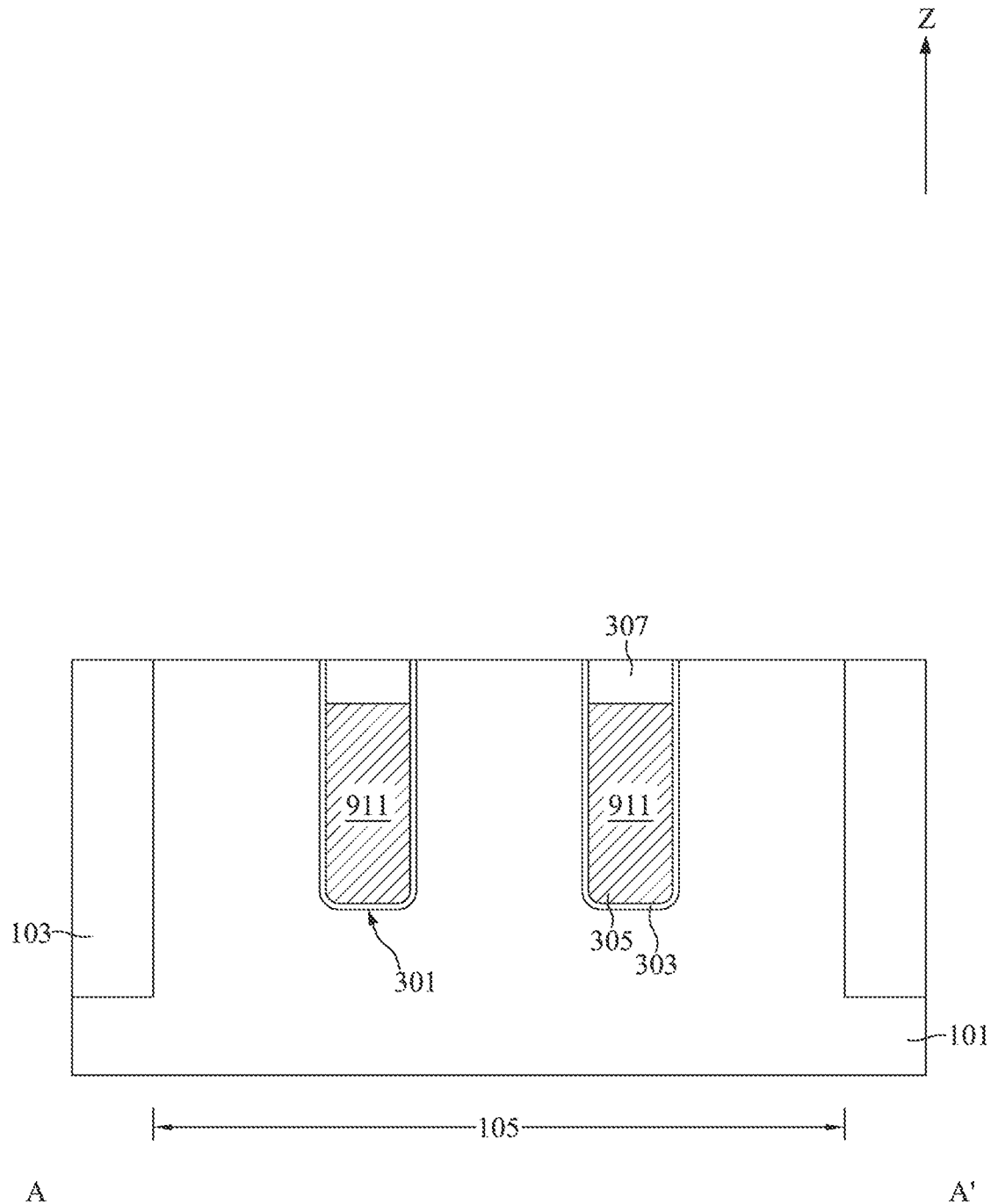

With reference to FIG. 11, a planarization process, such as chemical mechanical polishing, may be performed until the top surface of the substrate 101 is exposed to provide a substantially flat surface for subsequent processing steps. After the planarization process, the layer of first insulating material 913 may be turned into a word line dielectric layer 303 and the layer of second insulating material 915 may be turned into a word line capping layer 307. Top surface of the word line capping layer 307 may be substantially coplanar with the top surface of the substrate 101. The word line dielectric layer 303 may have a thickness between about 10 angstroms and about 30 angstroms.

In some embodiments, the word line capping layer 307 may be a stacked layer including a bottom capping layer formed of high-k dielectric material and a top capping layer formed of silicon oxide. The top capping layer formed of silicon oxide may reduce electric field at the top surface of the substrate 101; therefore, leakage current may be reduced.

In some embodiments, a liner layer may be formed between the word line dielectric layer 303 and the word line electrode 305. The liner layer may be formed of, for example, titanium, titanium nitride, titanium silicon nitride, tantalum, tantalum nitride, tantalum silicon nitride, and combination thereof. The liner layer may be employed to prevent the word line electrode 305 from flaking or spalling from the word line dielectric layer 303.

The word line dielectric layer 303, the word line electrode 305, and the word line capping layer 307 together form the word line structure 301.

With reference to FIG. 1 and FIGS. 12 to 14, at step S15, a plurality of impurity regions 201B, 201C may be formed in the substrate 101.

Figure 12:
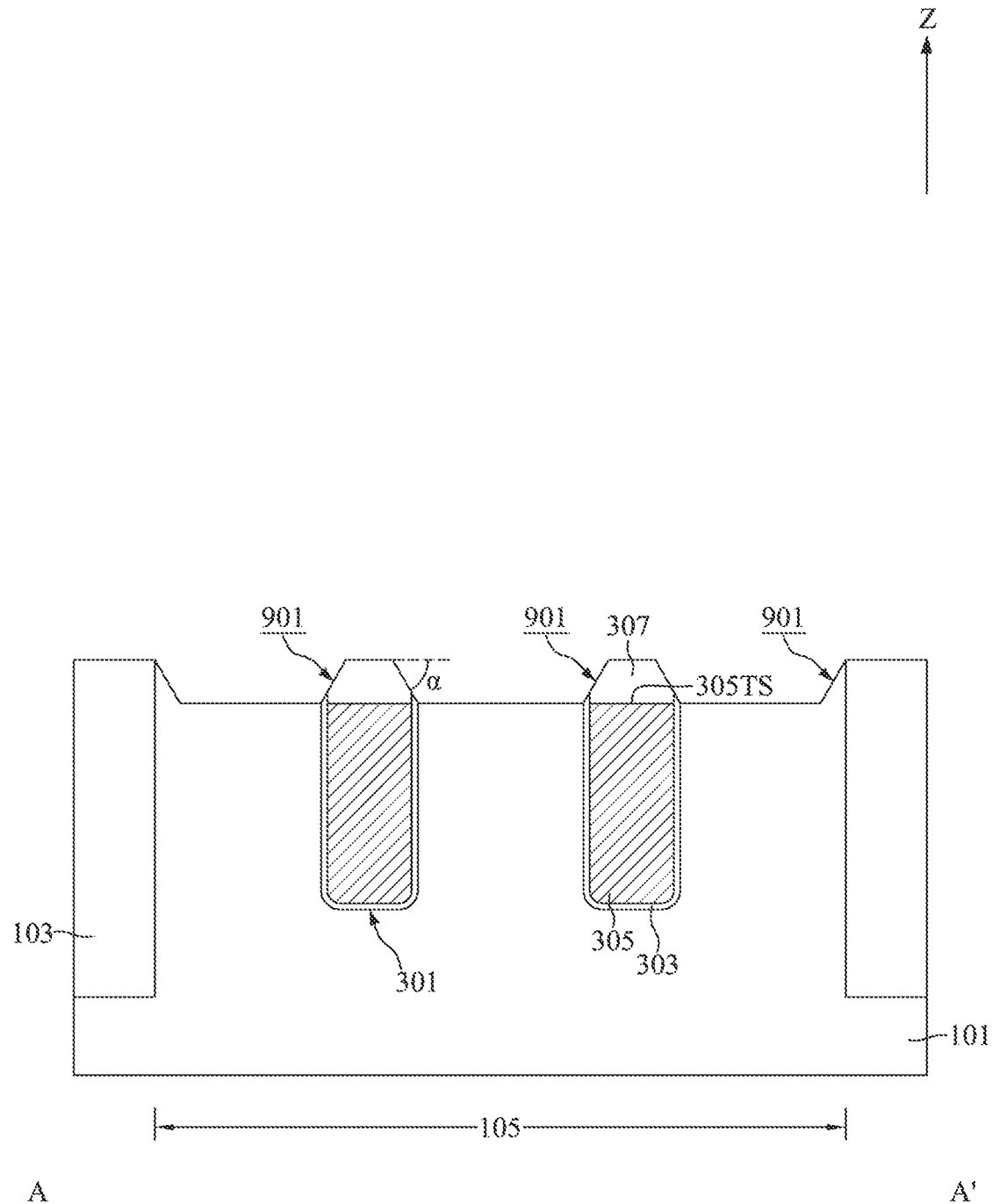

With reference to FIG. 12, a first etch process may be performed to remove portions of the substrate 101, portions of the word line dielectric layer 303, and portions of the word line capping layer 307 and integrally form a plurality of first recesses 901. For convenience of description, only one first recess 901 is described. The first recess 901 may have two tapering sidewalls opposing to each other. Horizontal distances between the two tapering sidewalls may gradually decrease from top to bottom along the direction Z. An angle α between any one of the tapering sidewall and the main plane of the substrate 101 (i.e., the X-Y plane) may be between about 45 degree and about 60 degree. In some embodiments, the first etch process may be an isotropic plasma dry etch process. In some embodiments, the first etch process may be a wet etch process.

It should be noted that the selectivity of an etching process may be generally expressed as a ratio of etching rates. For example, if one material is etched 25 times faster than other materials, the etch process may be described as having a selectivity of 25:1 or simply 25. In this regard, higher ratios or values indicate more selective etching processes.

Figure 13:
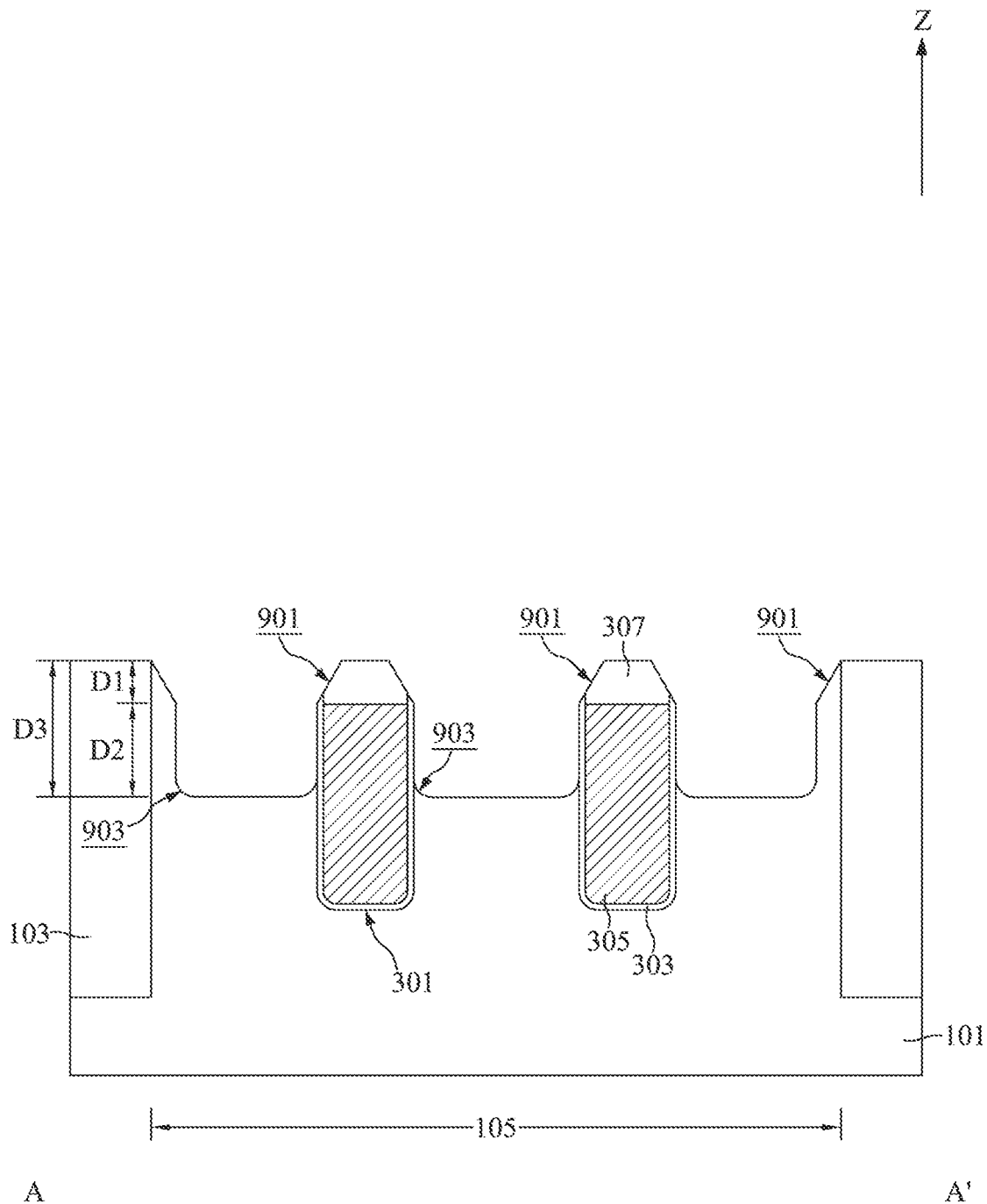

With reference to FIG. 13, a second etch process, such as an anisotropic plasma dry etch process, may be performed to remove portions of the substrate 101 and form a plurality of second recesses 903. In some embodiments, in the second etch process, an etching rate for the substrate 101 may be greater than an etching rate of the word line dielectric layer 303 and an etching rate of the word line capping layer 307. The selectivity of the second etch process may be greater than or equal to about 10, greater than or equal to about 12, greater than or equal to about 15, greater than or equal to about 20, or greater than or equal to about 25.

For convenience of description, only one second recess 903 is described. The second recess 903 may be expanded from the bottom surface of the first recess 901. In some embodiments, the bottom surface of the second recess 903 may be curved. In some embodiments, the bottom surface of the second recess 903 may be flat. In some embodiments, the second recess 903 may have an U-shaped cross-sectional profile. Corner effects may be avoided if the second recess 903 has an U-shape cross-sectional profile. A depth D1 of the first recess 901 may be equal to or less than one-fourth of a depth D2 of the second recess 903. In other words, the depth D1 of the first recess 901 may be equal to or less than one-fifth of a total depth D3 of sum of the first recess 901 and the second recess 903.

Figure 14:
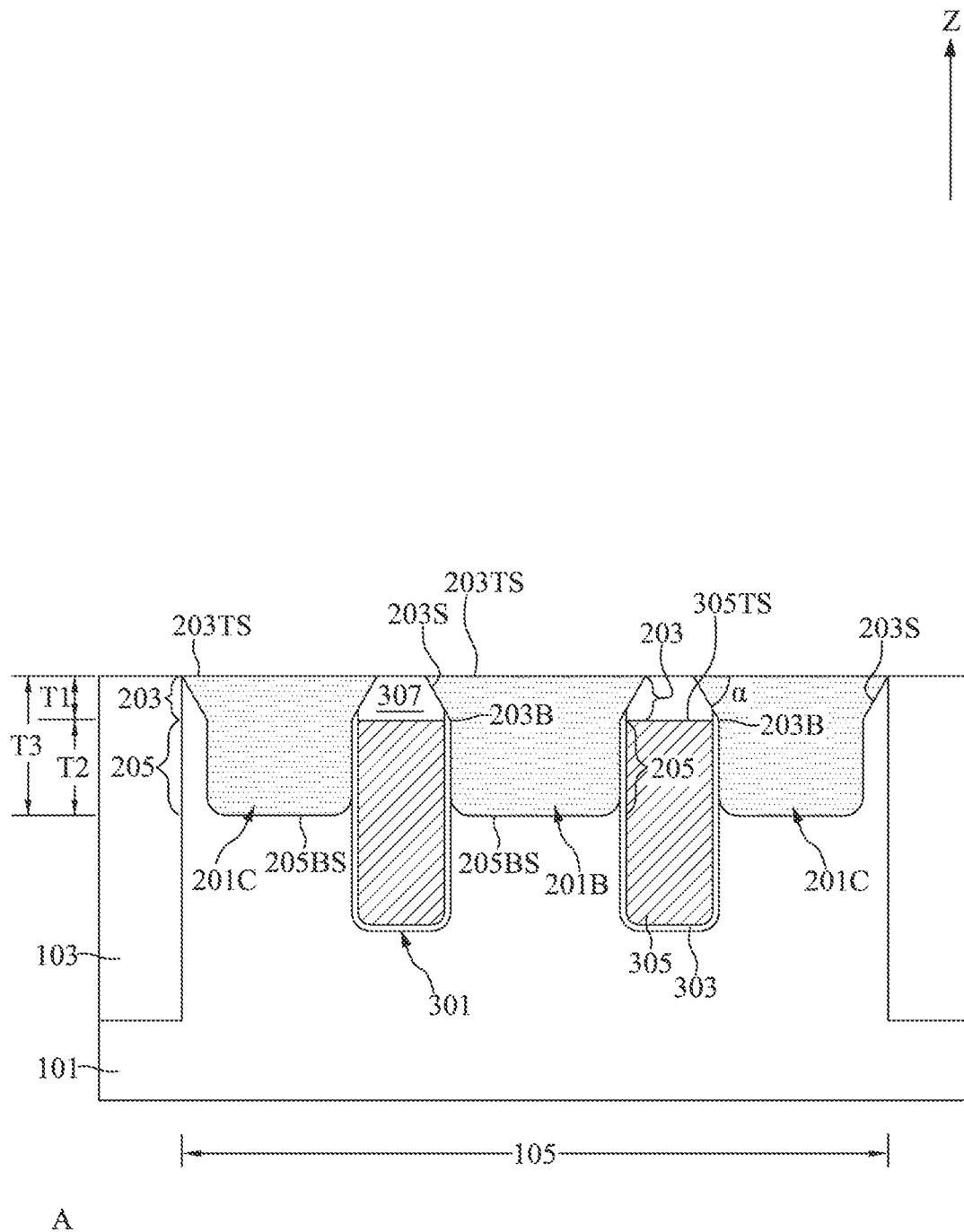

With reference to FIG. 14, an epitaxial growth process may be performed to fill the plurality of first recesses 901 and the plurality of second recesses 903 and integrally form the plurality of impurity regions 201B, 201C. The epitaxial growth process may be chemical vapor deposition, atomic layer deposition, or molecular beam epitaxy. In some embodiments, a process temperature of the epitaxial growth process may be between about 700° C. and about 850° C. A process pressure of the epitaxial growth process may be between about 5 Torr to about 50 Torr. In some embodiments, a planarization process, such as chemical mechanical polishing, may be optionally performed to provide a substantially flat surface for subsequent processing steps. In some embodiments, the plurality of impurity regions 201B, 201C may be formed protruding from the top surface of the substrate 101.

The shape (or structure) of the plurality of impurity regions 201B, 201C may be determined by the plurality of first recesses 901 and the plurality of second recesses 903. The impurity region 201B may be located between the two word line structures 301. The impurity regions 201C may be respectively correspondingly located opposite to the impurity region 201B with the two word line structures 301 interposed therebetween. The plurality of impurity regions 201B, 201C may include upper portions 203 and lower portions 205. The upper portions 203 of the plurality of impurity regions 201B, 201C may be located at where the plurality of first recesses 901 previously was. The lower portions 205 may be located at where the plurality of second recesses 903 previously was.

For convenience of description, only one upper portion 203 and one lower portion 205 are described. The upper portion 203 may include two tapering sidewalls 203S. A horizontal distance between the two tapering sidewalls 203S (i.e., a width of the upper portion 203) may gradually decrease from top to bottom along the direction Z. An angle α between any one of the tapering sidewall 203S and the top surface 203TS of the upper portion 203 may be between about 45 degree and about 60 degree. In other words, the upper portion 203 may have a tapering cross-sectional profile. The upper portion 203 may have bottommost points 203B respectively located at the intersections between the tapering sidewalls 203S and the lower portion 205. A thickness T1 (i.e., a vertical distance between the top surface 203TS of the upper portion 203 and the bottommost point 203B) of the upper portion 203 may be equal to or less than one-fourth of a thickness T2 (i.e., a vertical distance between the bottom surface 205BS of the lower portion 205 and the bottommost point 203B) of the lower portion 205. In other words, the thickness T1 of the upper portion 203 may be equal to or less than one-fifth of a total thickness T3 (i.e., a vertical distance between the top surface 203TS of the upper portion 203 and the bottom surface 205BS of the lower portion 205) of the impurity region 203B/203C.

In some embodiments, the plurality of impurity regions 201B, 201C may be formed of, for example, silicon phosphide (SiP), phosphorus-doped silicon carbon (SiCP), silicon carbide (SiC), silicon germanium (SiGe), silicon-germanium-tin alloy (SiGeSn), silicon-germanium-boron alloy (SiGeB), or other suitable semiconductor material.

In some embodiments, the impurity region 201B/201C may be doped with a dopant such as phosphorus or boron. The dopant concentration of the impurity region 201B/201C may be uniform. In some embodiments, the dopant concentration of the impurity region 201B/201C may be gradually increased from bottom to top. In some embodiments, the dopant concentration of the upper portion 203 may be greater than the dopant concentration of the lower portion 205. In some embodiments, the dopant concentration of the upper portion 203 may be gradually increased from the bottommost points 203B to the top surface 203TS. The greater dopant concentration may reduce the resistance between the impurity region 201B/201C and contacts or conductive lines which will later formed thereon.

In some embodiments, the top surface 305TS of the word line electrode 305 may be at a vertical level lower than the vertical level of the bottommost points 203B. In some embodiments, the top surface 305TS of the word line electrode 305 and the bottommost points 203B may be at a same vertical level. In some embodiments, the word line dielectric layer 303 may contact the lower portions 205 of the impurity regions 201B/201C.

Figure 15:
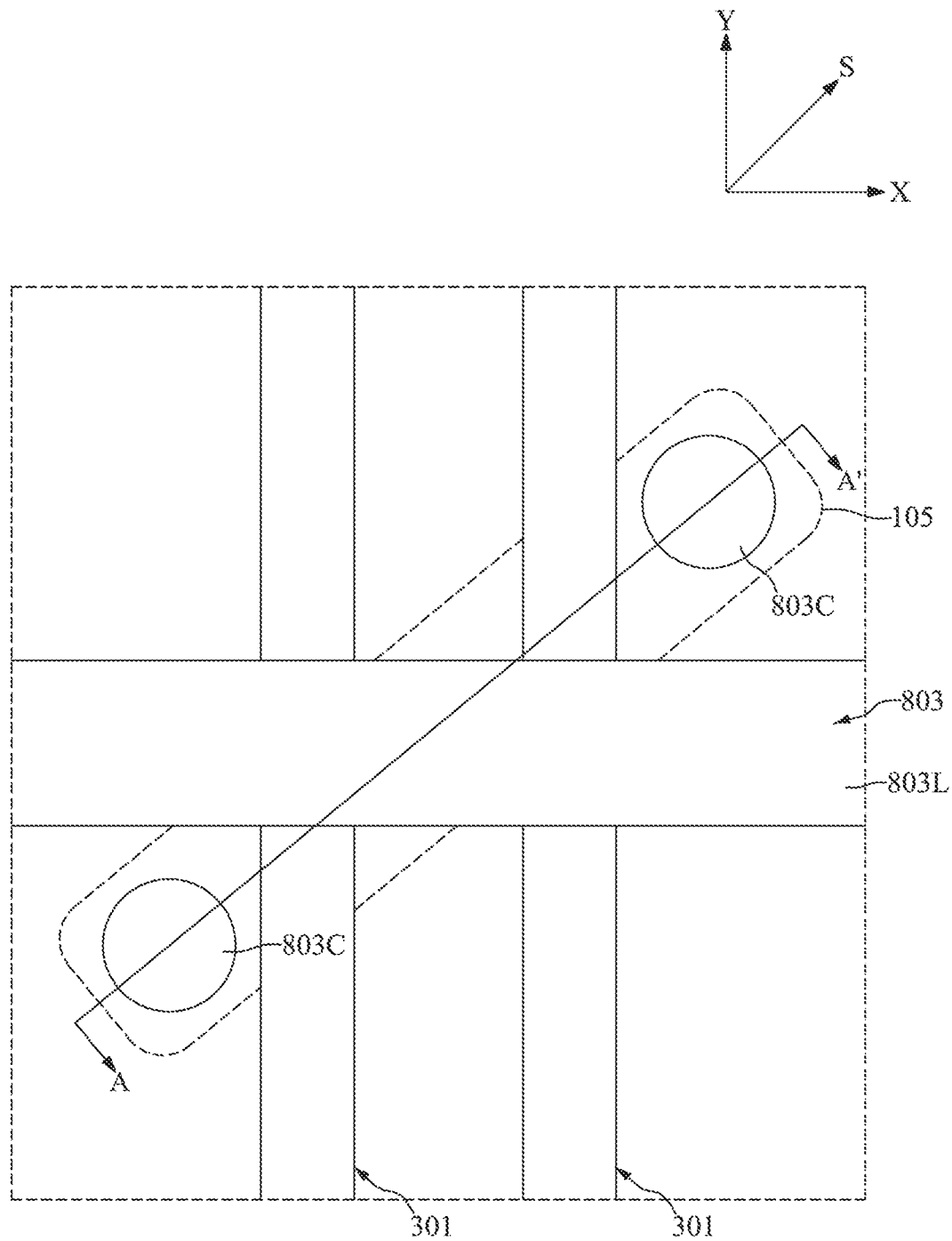
FIG. 15 illustrates, in a schematic top-view diagram, an intermediate semiconductor device in accordance with one embodiment of the present disclosure.

FIG. 15 illustrates, in a schematic top-view diagram, an intermediate semiconductor device in accordance with one embodiment of the present disclosure. FIGS. 16 to 20 are schematic cross-sectional view diagrams taken along the line A-A' in FIG. 15 illustrating part of the flow for fabricating the semiconductor device 100A in accordance with one embodiment of the present disclosure.

With reference to FIG. 1 and FIGS. 15 to 17, at step S17, a first conductive line 401 and two bottom contacts 501 may be formed on the substrate 101.

Figure 16:
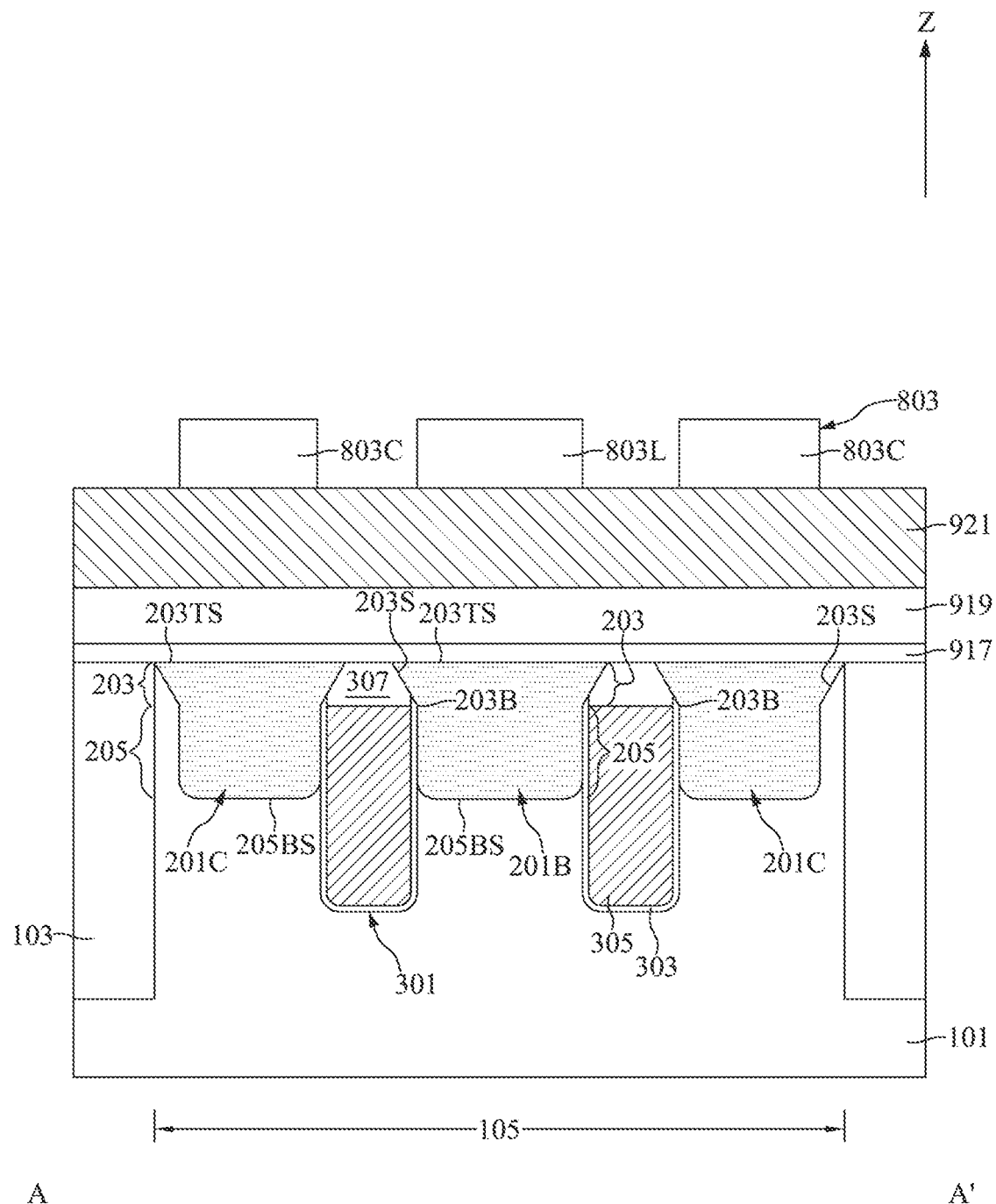
FIGS. 16 to 20 are schematic cross-sectional view diagrams taken along the line A-A' in FIG. 15 illustrating part of the flow for fabricating the semiconductor device in accordance with one embodiment of the present disclosure.

With reference to FIGS. 15 and 16, a layer of barrier material 917, a layer of first conductive material 919, a layer of mask material 921, and a second mask layer 803 may be sequentially formed on the substrate 101. The barrier material 917 may be, for example, titanium, titanium nitride, titanium silicon nitride, tantalum, tantalum nitride, tantalum silicon nitride, and combination thereof. The first conductive material 919 may be, for example, a conductive material such as doped polysilicon, metal, metal nitride, or metal silicide. The mask material 921 may be, for example, silicon nitride.

The second mask layer 803 may include a line portion 803L and two circle portions 803C. In a top-view perspective, the line portion 803L may be line shape and may extend along the direction X. The direction X may be perpendicular to the direction Y and be slanted with respect to the direction S. The line portion 803L may be formed intersecting the impurity region 201B. The line portion 803L may define the position of the first conductive line 401 as will be fabricated later. In a top-view perspective, the two circle portions 803C may be round shape and may be respectively correspondingly formed on the impurity regions 201G. The two circle portions 803C may define positions of the two bottom contacts 501 as will be fabricated later. For convenience of description, only one circle portion 803C is described.

Figure 17:
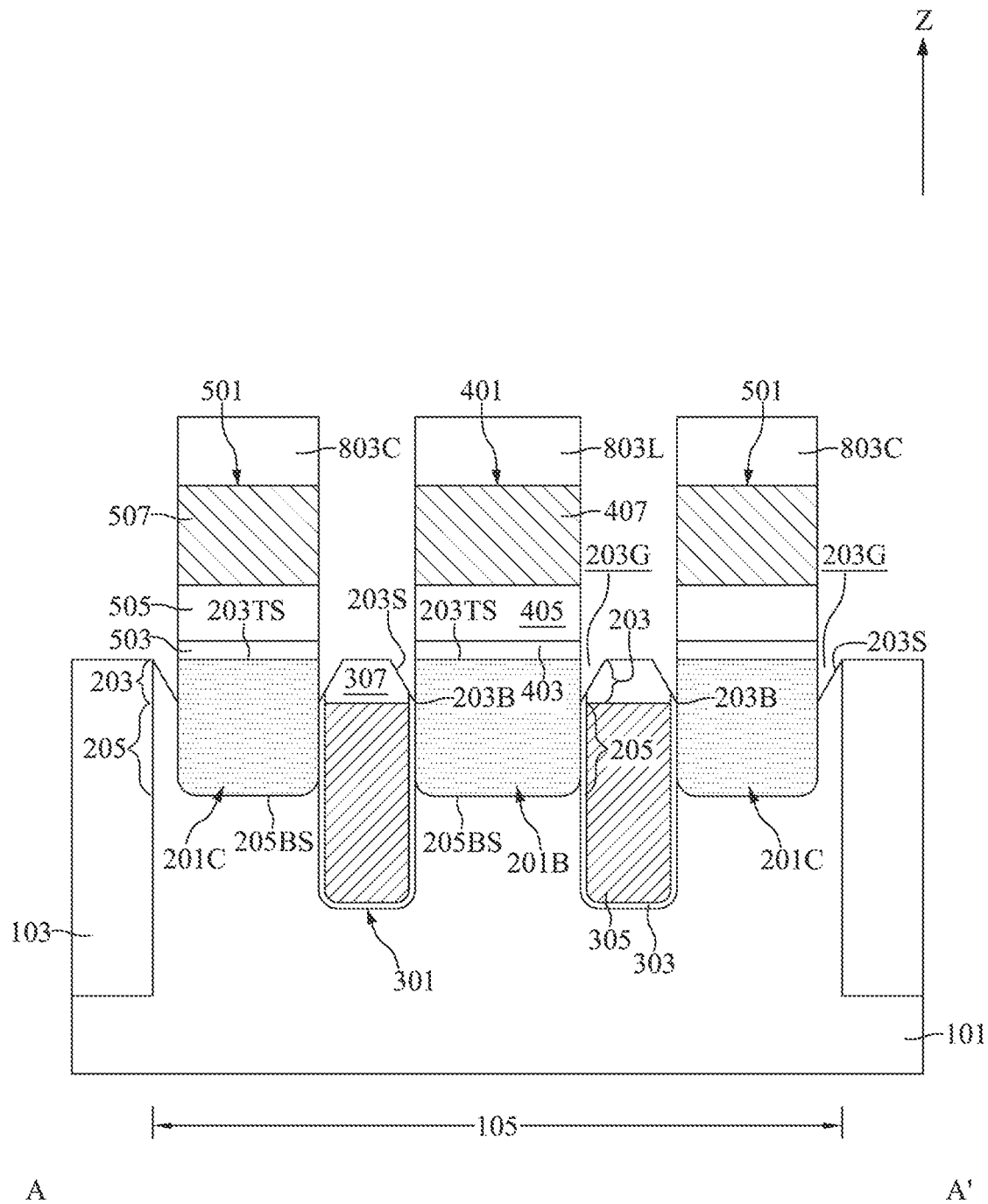

With reference to FIG. 17, an etch process may be performed to remove portions of the layer of barrier material 917, the layer of first conductive material 919, and the layer of mask material 921. After the etch process, the layer of barrier material 917 may be turned into a first conductive line barrier layer 403 and two bottom contact barrier layers 503. The layer of first conductive material 919 may be turned into a first conductive line 401 and two bottom contact conductive layers 505. The layer of mask material 921 may be turned into a first conductive line mask layer 407 and two bottom contact mask layers 507. In some embodiments, portions of the impurity regions 201B/201C may be also removed by the etch process and a plurality of gaps 203G may be formed adjacent to the tapering sidewalls 203S.

The first conductive line barrier layer 403, the first conductive line conductive layer 405, and the first conductive line mask layer 407 together form the first conductive line 401. The bottom contact barrier layers 503, the bottom contact conductive layers 505, and the bottom contact mask layers 507 together form the bottom contact 501. The shapes and dimension of the second mask layer 803 may inherited by the first conductive line 401 and the two bottom contacts 501.

In some embodiments, the first conductive line barrier layer 403 and the bottom contact barrier layer 503 may be stacked layer including a bottom layer formed of titanium and a top layer formed of titanium nitride. In some embodiments, the first conductive line conductive layer 405 and the bottom contact conductive layers 505 may be stacked layer including a bottom layer formed of tungsten nitride and a top layer formed of tungsten.

Figure 18:
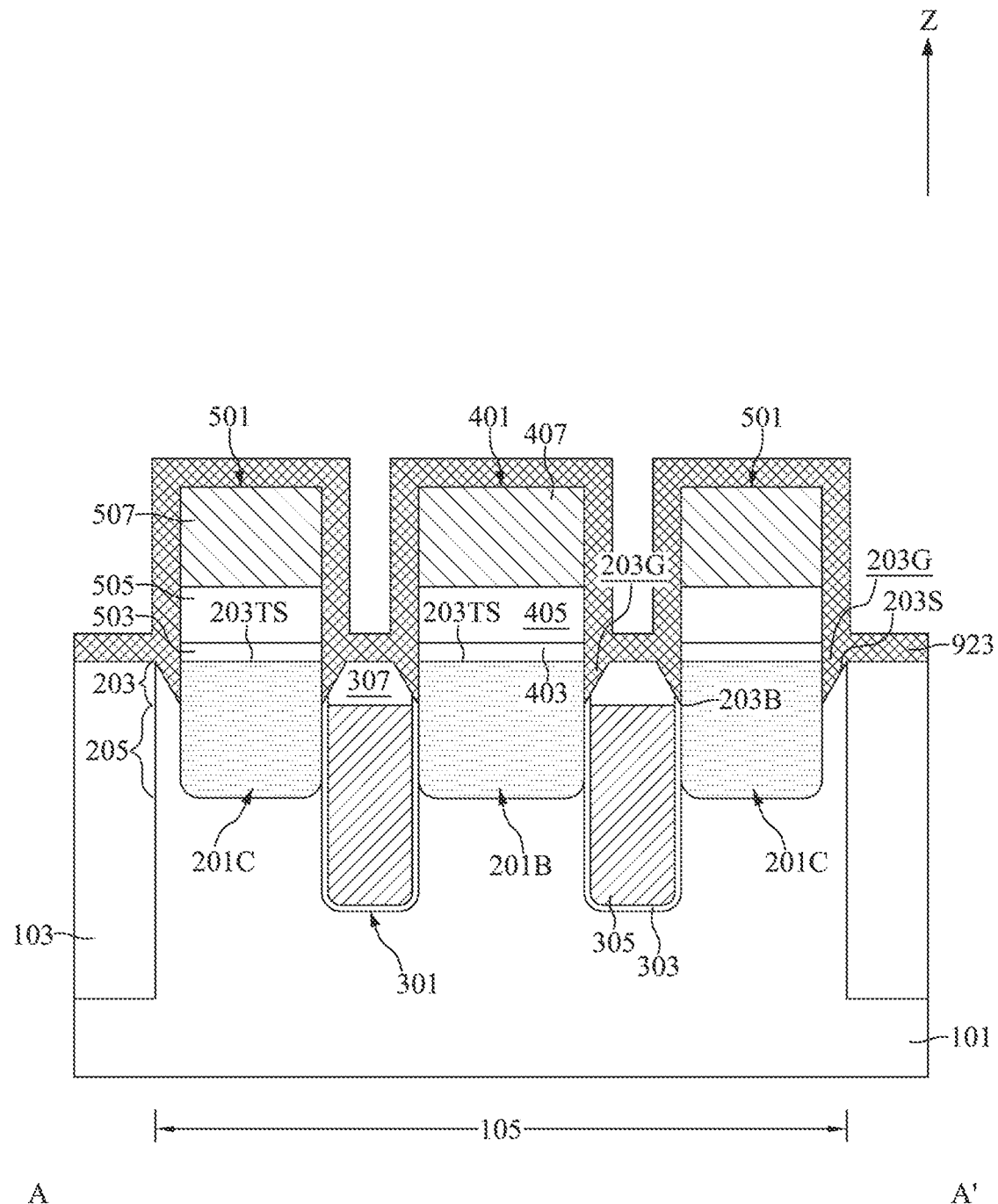
Figure 19:
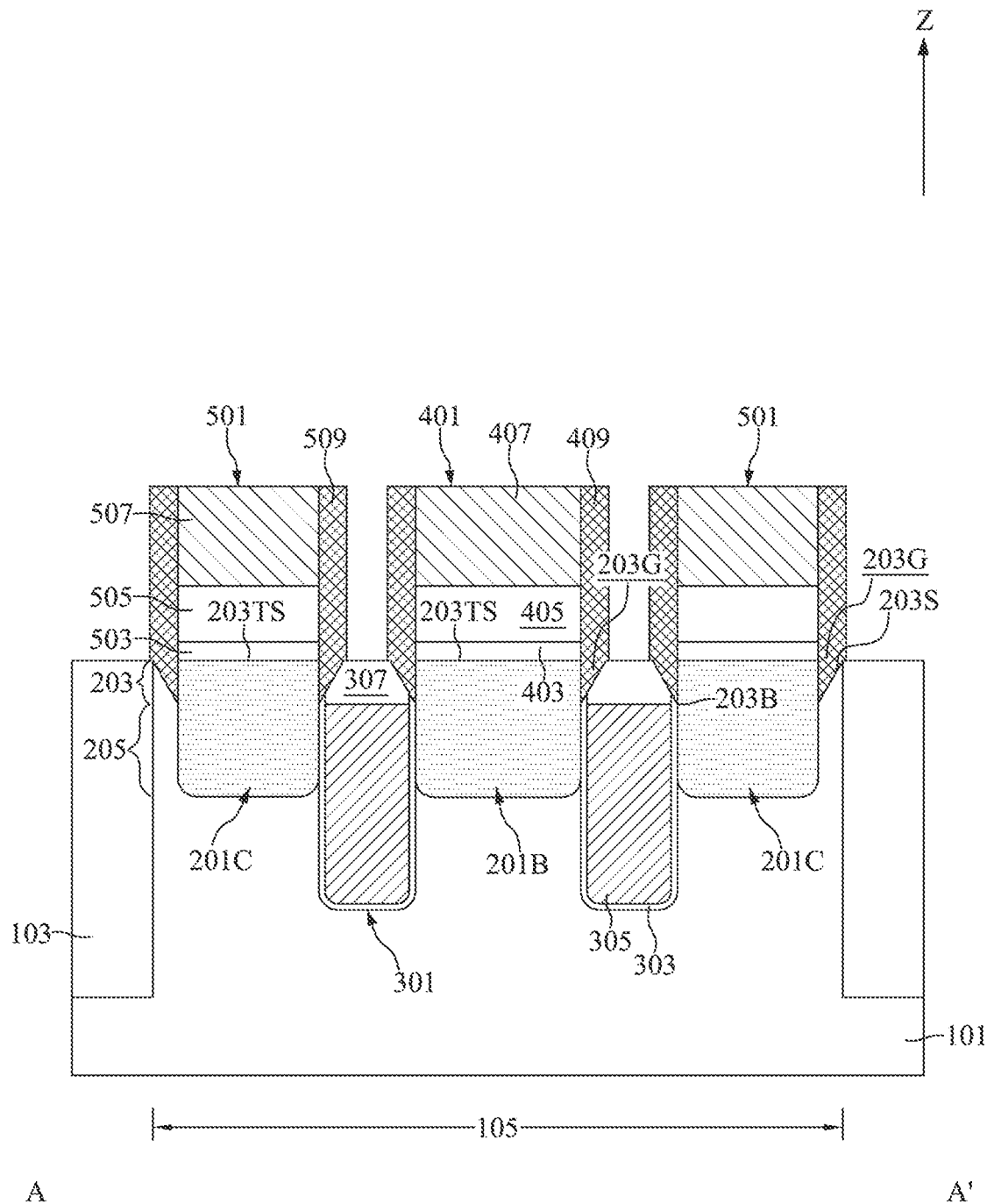

With reference to FIGS. 1, 18, and 19, at step S19, first conductive line spacers 409 may be formed on sidewalls of the first conductive line 401 and bottom contact spacers 509 may be formed on sidewalls of the two bottom contacts 501.

With reference to FIG. 18, the second mask layer 803 may be removed. A spacer layer 923 may be formed to cover the top surface of the substrate 101, the first conductive line 401, and the two bottom contacts 501. The spacer layer 923 may be formed of, for example, silicon nitride. The spacer layer 923 may have a thickness thick enough to interrupt the space filling procedure, which will be performed later, between the first conductive line 401 and the two bottom contacts 501. Specifically, the thickness of the spacer layer 923, specially the spacer layer 923 attached on the sidewalls of the first conductive line 401 and sidewalls of the two bottom contacts 501, may compress the volumes of the spaces between the first conductive line 401 and the two bottom contacts 501. Therefore, a first insulating layer 107, which will be deposited later, may hardly fill the compressed spaces between the first conductive line 401 and the two bottom contacts 501.

Figure 21:
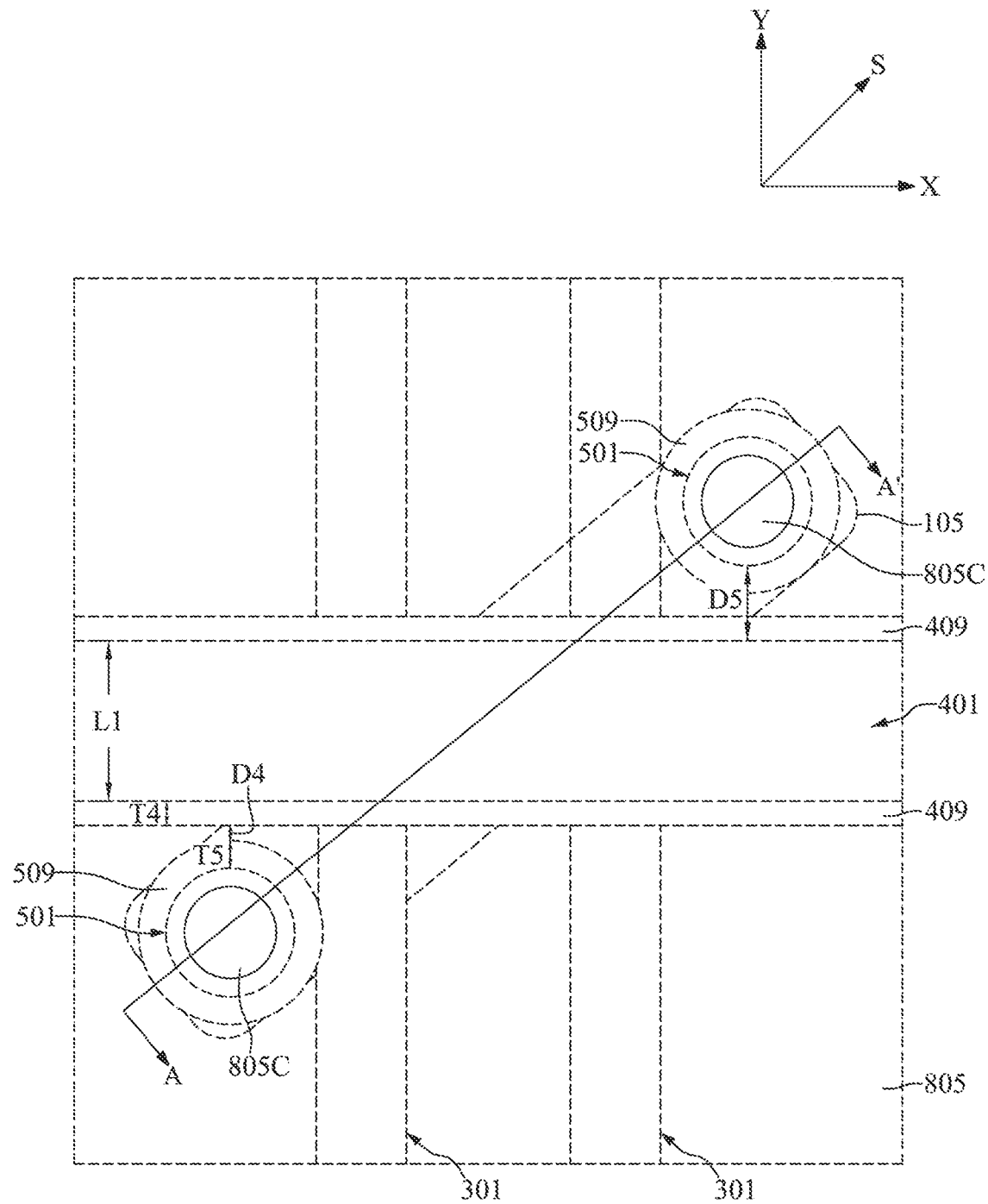
FIG. 21 illustrates, in a schematic top-view diagram, an intermediate semiconductor device in accordance with one embodiment of the present disclosure.

With reference to FIG. 19, an etch process, such as an anisotropic dry etch process, may be performed to remove portions of the spacer layer 923 and integrally form the first conductive line spacers 409 and the bottom contact spacers 509. In some embodiments, the first conductive line spacers 409 and the bottom contact spacers 509 may partially fill the plurality of gaps 203G. In some embodiments, the first conductive line spacers 409 and the bottom contact spacers 509 may completely fill the plurality of gaps 203G. In some embodiments, a distance D4 (as shown in FIG. 21) between the first conductive line 401 and the bottom contact 501 may be less than one-fourth of a line width L1 (as shown in FIG. 21) of the first conductive line 401. In some embodiments, a sum of a thickness T4 (as shown in FIG. 21) of the first conductive line spacer 409 and a thickness T5 (as shown in FIG. 21) of the bottom contact spacer 509 may be equal to or greater than one-half of a distance D5 (as shown in FIG. 21) between the first conductive line 401 and the bottom contact 501.

Figure 20:
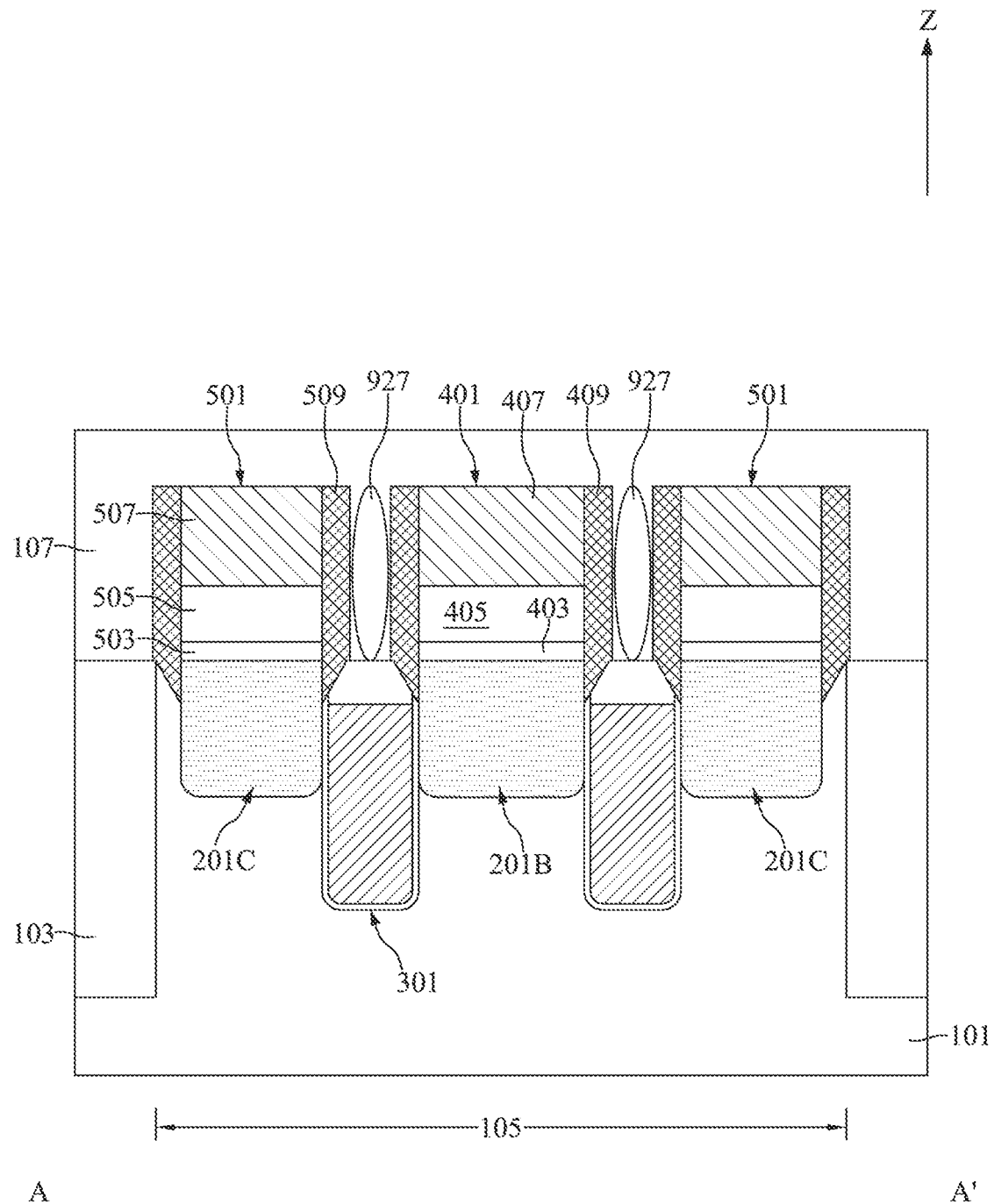

With reference to FIGS. 1 and 20, at step S21, a plurality of air gaps 927 may be formed between the first conductive line spacers 409 and the bottom contact spacers 509.

With reference to FIG. 20, a first insulating layer 107 may be formed over the intermediate semiconductor device in FIG. 19. The first insulating layer 107 may be silicon oxide, flowable oxide, undoped silica glass, borosilica glass, phosphosilica glass, borophosphosilica glass, fluoride silicate glass, carbon-doped silicon oxide, or a combination thereof. A planarization process, such as chemical mechanical polishing, may be performed to provide a substantially flat surface for subsequent processing steps. Due to the thick first conductive line spacers 409 and the bottom contact spacers 509, the first insulating layer 107 may not completely fill the narrow spaces between the first conductive line 401 and the two bottom contacts 501. As a result, the plurality of air gaps 927 may be spontaneously formed between the first conductive line spacers 409 and the bottom contact spacers 509. A planarization process, such as chemical mechanical polishing, may be subsequently performed to provide a substantially flat surface for subsequent processing steps.

Figure 22:
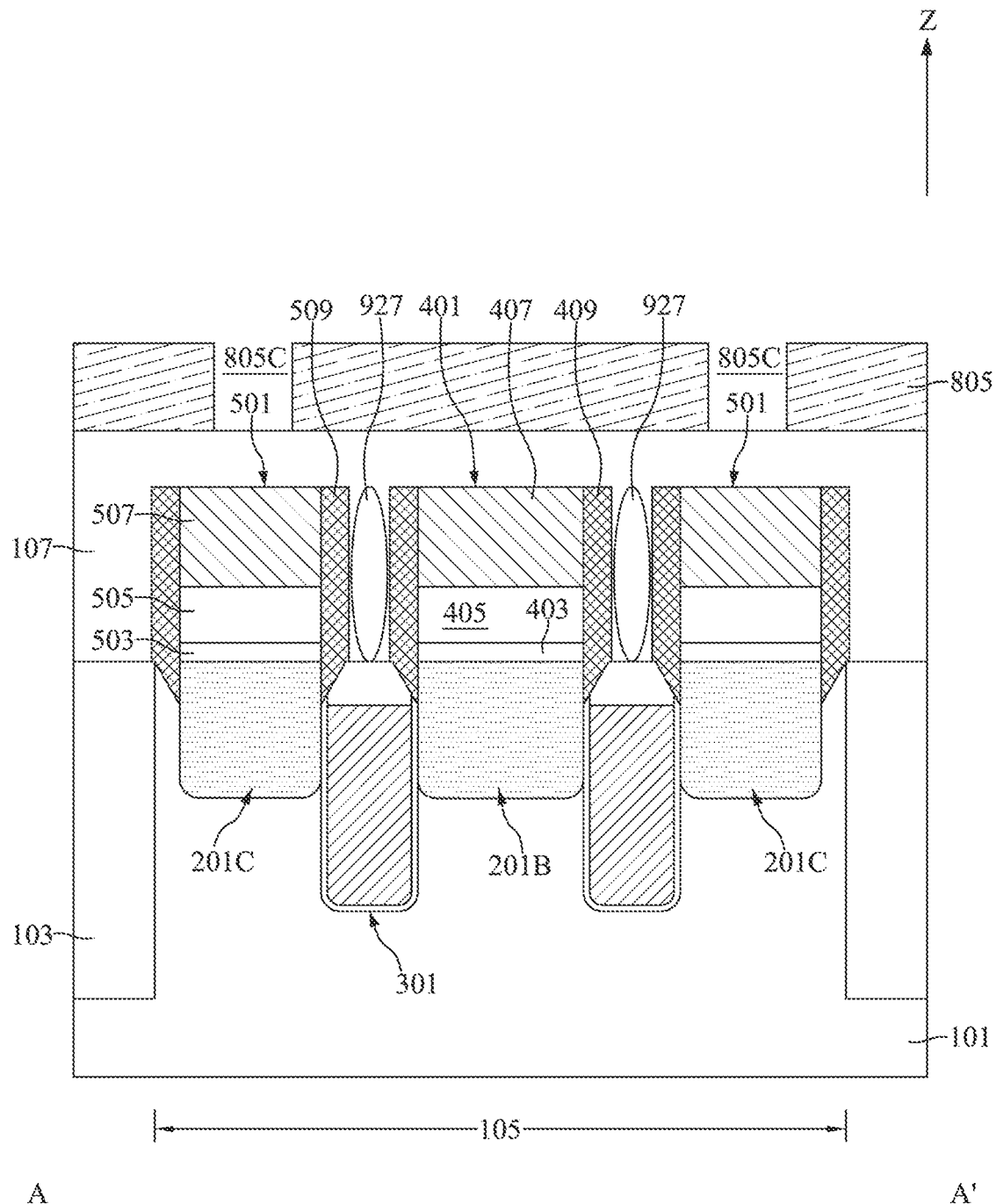
FIGS. 22 to 24 are schematic cross-sectional view diagrams taken along the line A-A' in FIG. 21 illustrating part of the flow for fabricating the semiconductor device in accordance with one embodiment of the present disclosure.
Figure 23:
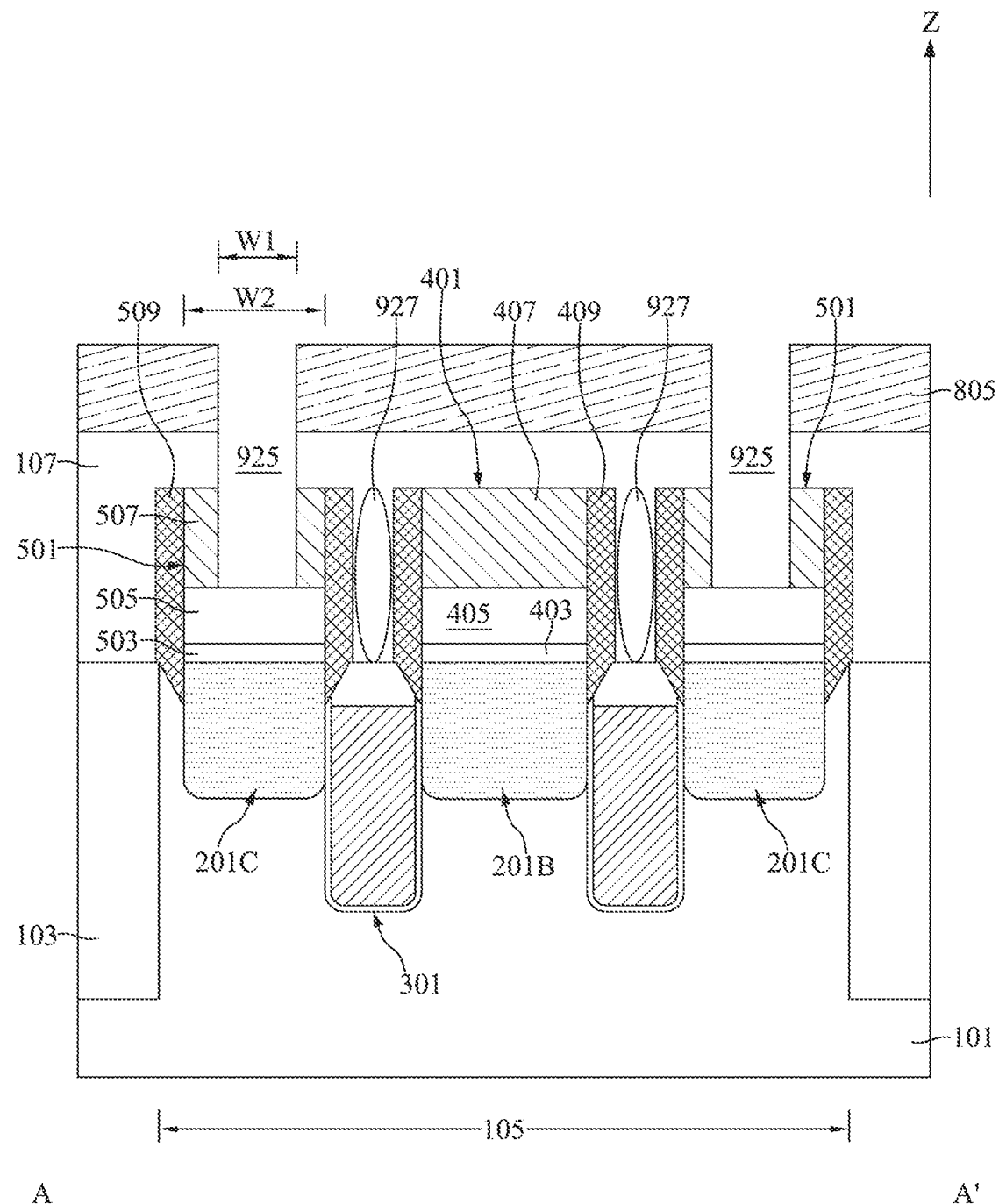
Figure 24:
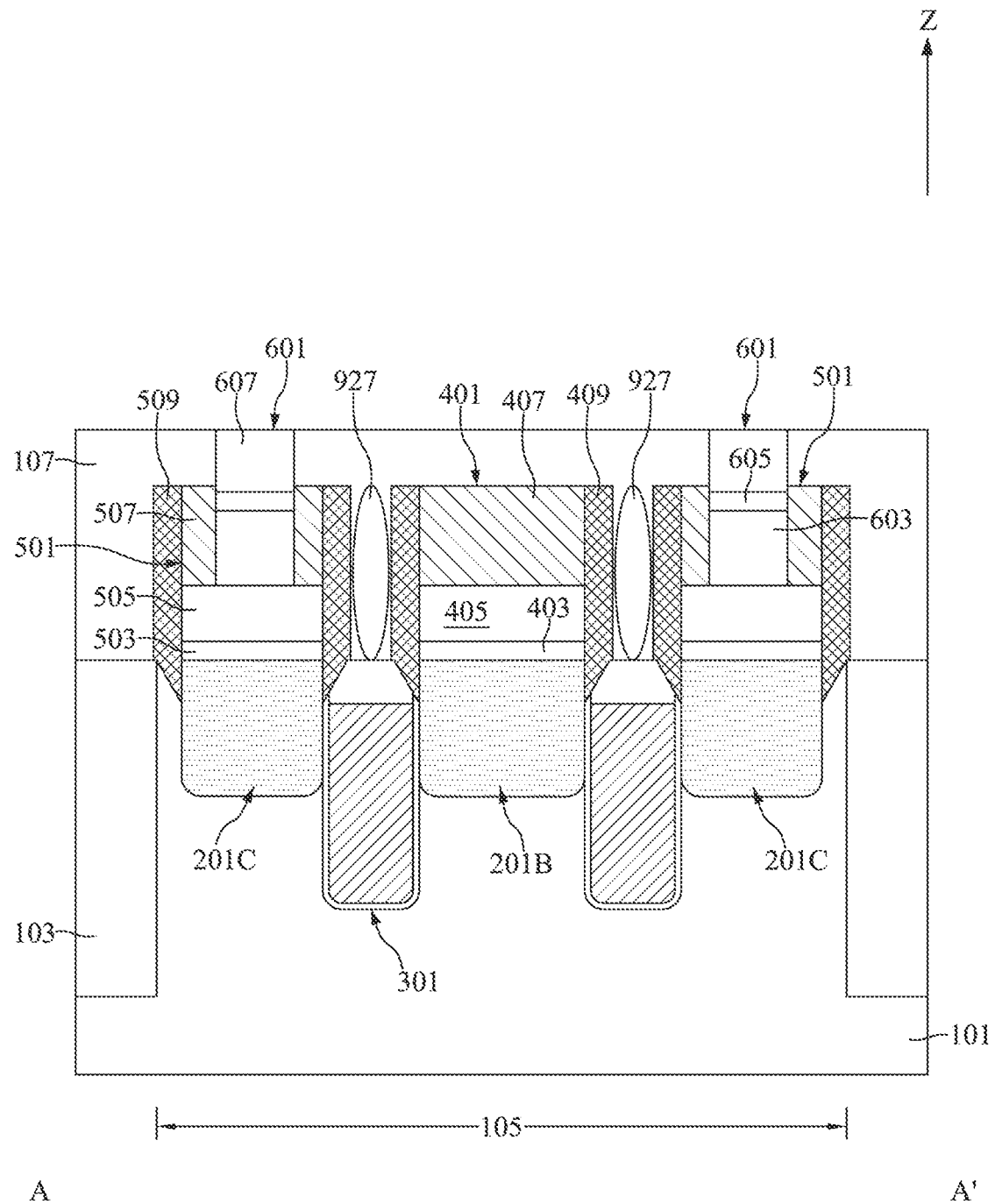

FIG. 21 illustrates, in a schematic top-view diagram, an intermediate semiconductor device in accordance with one embodiment of the present disclosure. FIGS. 22 to 24 are schematic cross-sectional view diagrams taken along the line A-A' in FIG. 21 illustrating part of the flow for fabricating the semiconductor device 100A in accordance with one embodiment of the present disclosure.

With reference to FIG. 1 and FIGS. 21 to 24, at step S23, two top contacts 601 may be formed on the two bottom contacts 501.

With reference to FIGS. 21 and 22, a third mask layer 805 may be formed on the first insulating layer 107. The third mask layer 805 may include two openings 805C. In a top-view perspective, the two openings 805C may have a round shape or an oval shape. The two openings 805C may be respectively correspondingly formed on the two capacitor bottom contacts 501. The two openings 805C may define positions of the top contacts 601 as will be fabricated later.

With reference to FIG. 23, an etch process, such as an anisotropic dry etch process, may be performed to remove portions of the first insulating layer 107, and the bottom contact mask layers 507 and integrally form second openings 925. The top surfaces of the two bottom contact conductive layers 505 may be exposed through the second openings 925. In some embodiments, the width W1 of the second opening 925 may be less than the width W2 of the bottom contact 501.

With reference to FIG. 24, the two top contacts 601 may be formed in the second openings 925. For convenience of description, only one top contact 601 is described. In some embodiments, the top contact 601 may be a single layer including a conductive material such as doped polysilicon, metal, metal nitride, or metal silicide. The capacitor top contact 601 may be formed by depositing the conductive material into the second opening 925 and subsequently performing a planarization process to remove excess material and provide a substantially flat surface for subsequent processing steps.

In some embodiments, the top contact 601 may include a first conductive layer 603, a second conductive layer 605, and a third conductive layer 607 sequentially formed in the second opening 925. The first conductive layer 603 may be formed of, for example, doped polysilicon. The first conductive layer 603 may be formed by performing a deposition process and a subsequent etch back process.

The second conductive layer 605 may be formed of, for example, titanium silicide, nickel silicide, nickel platinum silicide, tantalum silicide, or cobalt silicide. The second conductive layer 605 may have a thickness between about 2 nm and about 20 nm. Firstly, a layer of conductive material may be formed filled the second opening 925. The conductive material may include, for example, titanium, nickel, platinum, tantalum, or cobalt. A thermal treatment may be subsequently performed. During the thermal treatment, metal atoms of the metal layer may react chemically with silicon atoms of first conductive layer 603 to form the second conductive layer 605. The thermal treatment may be a dynamic surface annealing process. After the thermal treatment, a cleaning process may be performed to remove the unreacted conductive material. The cleaning process may use etchant such as hydrogen peroxide and an SC-1 solution.

The third conductive layer 607 may be formed of, for example, metal or metal nitride. The third conductive layer 607 may be formed by performing a deposition process and a subsequent planarization process to remove excess material and provide a substantially flat surface for subsequent processing steps.

Figure 25:
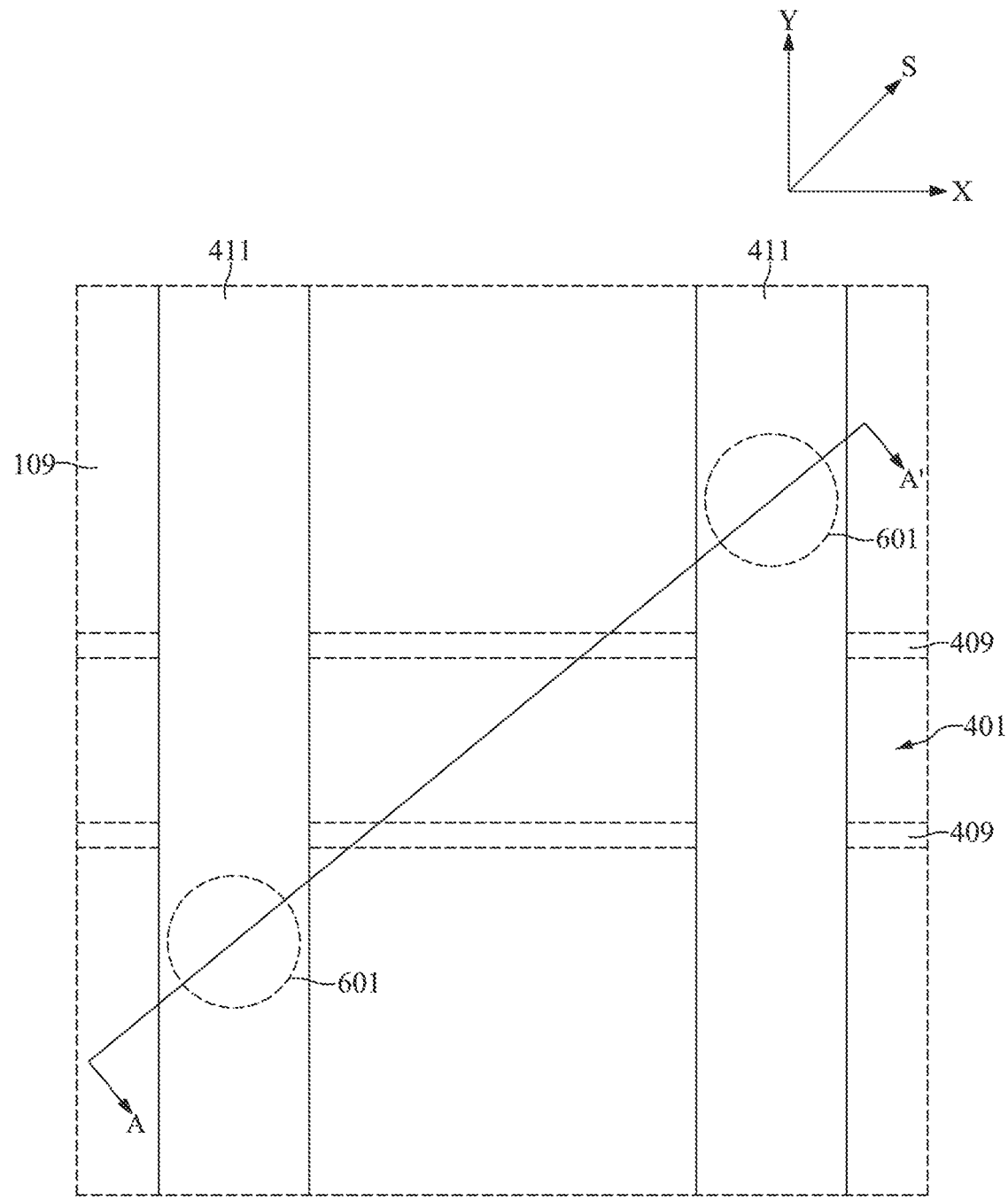
FIG. 25 illustrates, in a schematic top-view diagram, an intermediate semiconductor device in accordance with one embodiment of the present disclosure.
Figure 26:
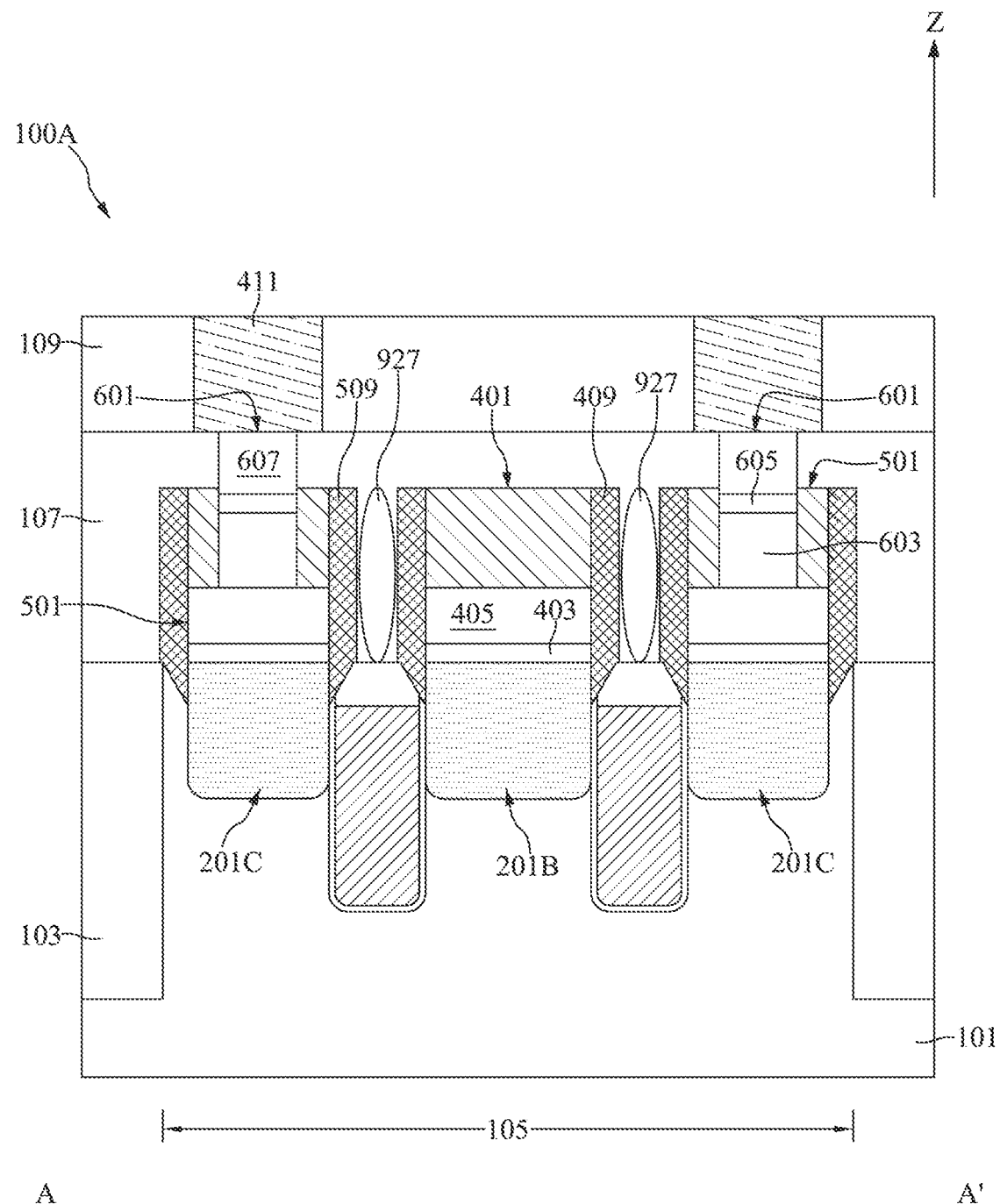
FIG. 26 is schematic cross-sectional view diagram taken along the line A-A' in FIG. 25 illustrating part of the flow for fabricating the semiconductor device in accordance with one embodiment of the present disclosure.

FIG. 25 illustrates, in a schematic top-view diagram, an intermediate semiconductor device in accordance with one embodiment of the present disclosure. FIG. 26 is schematic cross-sectional view diagram taken along the line A-A' in FIG. 25 illustrating part of the flow for fabricating the semiconductor device 100A in accordance with one embodiment of the present disclosure.

With reference to FIGS. 1, 25, and 26, at step S25, two second conductive lines 411 may be formed on the two top contacts 601.

With reference to FIGS. 25 and 26, a second insulating layer 109 may be formed on the first insulating layer 107. The second insulating layer 109 may be formed of a same material as the first insulating layer 107 but is not limited thereto. The two second conductive lines 411 may be formed in the second insulating layer 109 and on the two top contacts 601 by, for example, a damascene process. In a top-view perspective, the second conductive line 411 may extend along a second direction different from the first conductive line 401. For example, the second conductive line 411 may extend along the direction Y perpendicular to the first conductive line 401 extended along the direction X. The second conductive line 411 may be formed of, for example, tungsten, aluminum, copper, nickel, or cobalt.

FIGS. 27 to 40 illustrate, in schematic cross-sectional diagrams, intermediate semiconductor devices in accordance with other embodiments of the present disclosure.

Figure 27:
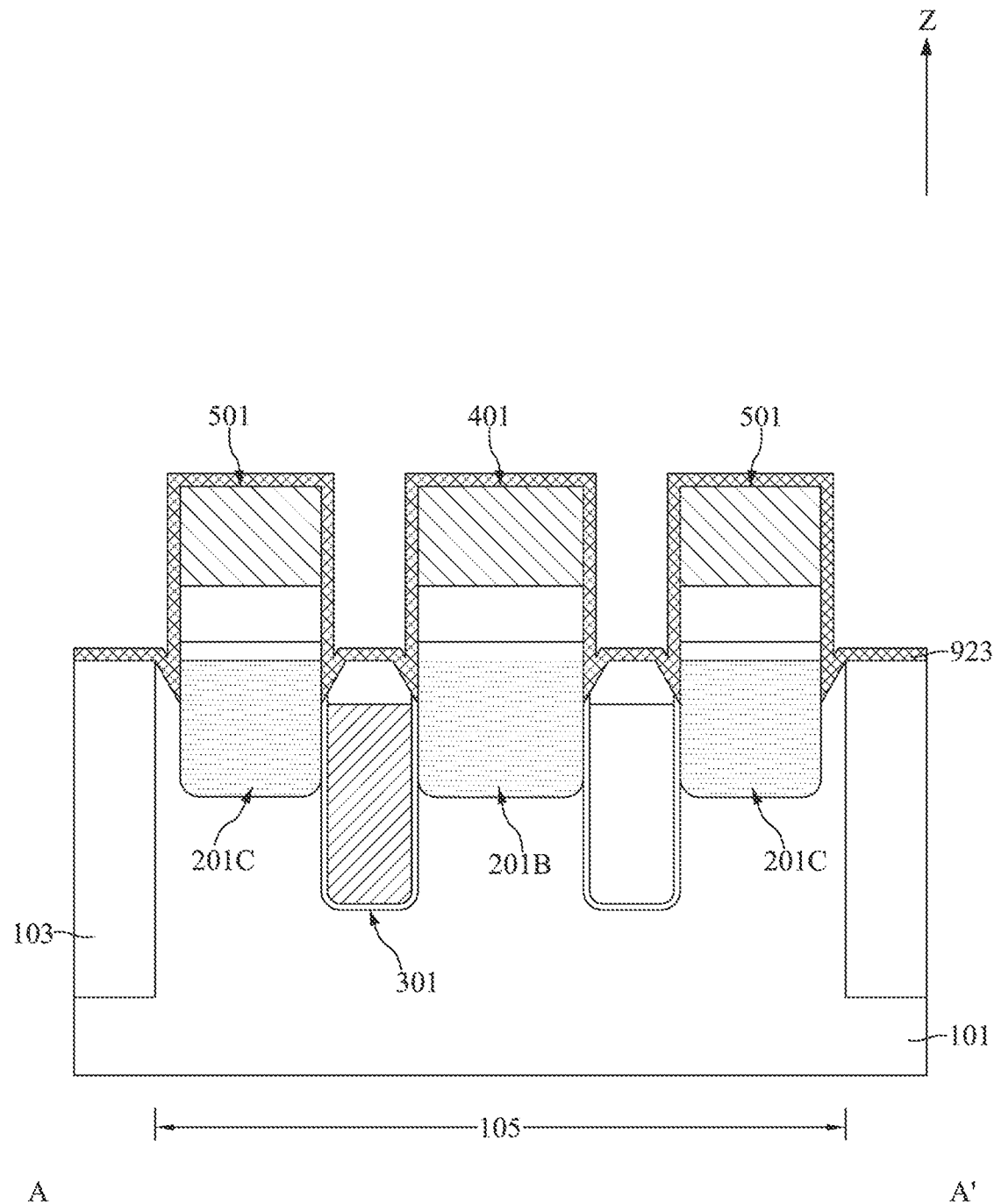
FIGS. 27 to 40 illustrate, in schematic cross-sectional diagrams, intermediate semiconductor devices in accordance with other embodiments of the present disclosure.

With reference to FIG. 27, an intermediate semiconductor device as illustrated in FIG. 17 may be fabricated. The spacer layer 923 may be formed over the intermediate semiconductor device. A thickness of the spacer layer 923 may be thin enough to avoid any air gap formation during subsequent deposition process. In the other hand, the thickness of the spacer layer 923 may also thick enough to provide sufficient protection for the first conductive line 401 and the two bottom contacts 501 during subsequent semiconductor process.

Figure 28:
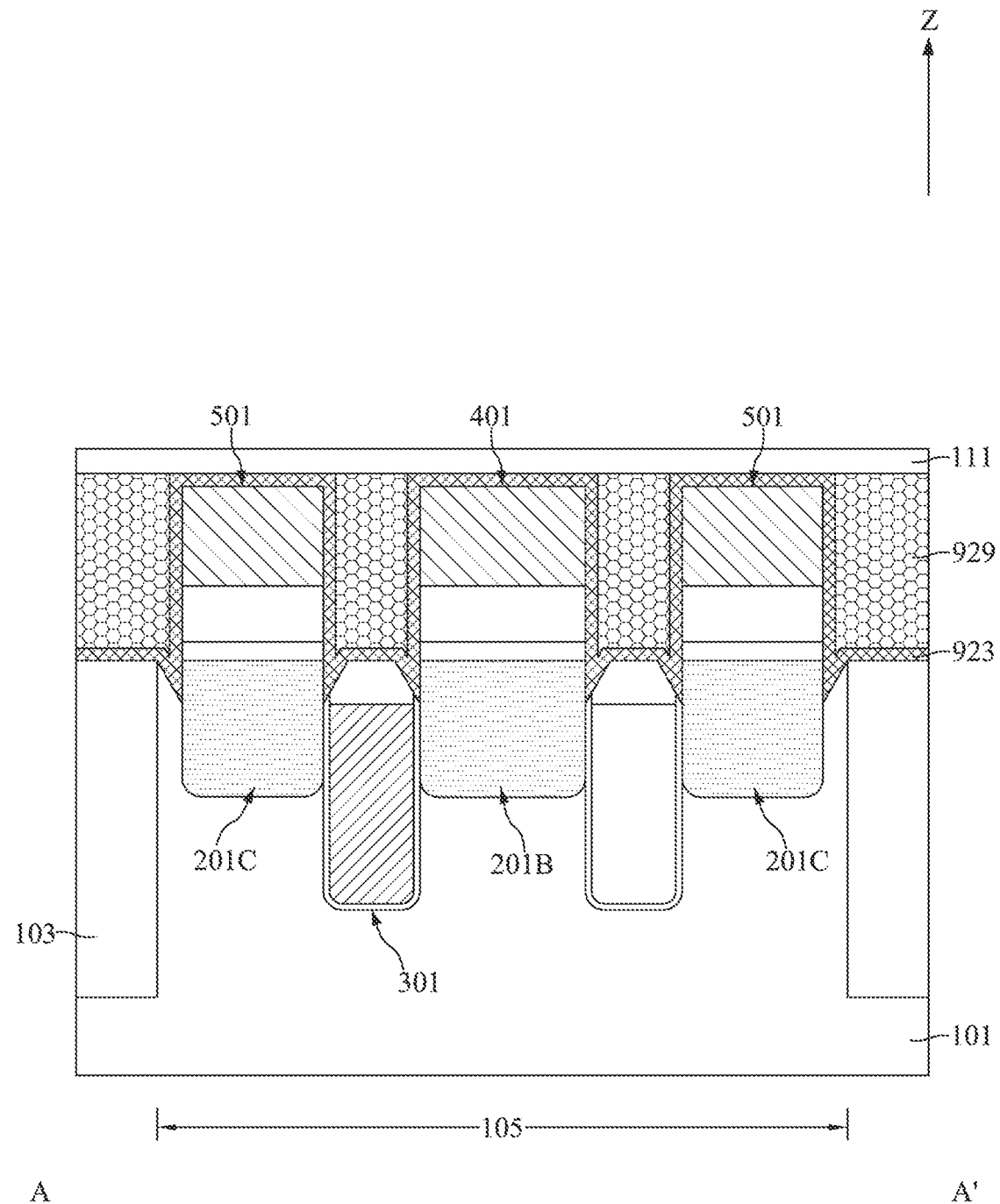

With reference to FIG. 28, a layer of energy-removable material 929 may be formed to cover the spacer layer 923 and completely fill the spaces between the spacer layer 923 attached on the sidewalls of the first conductive line 401 and the spacer layer 923 attached on the sidewalls of the two bottom contacts 501. A planarization process, such as chemical mechanical polishing, may be performed until the top surface of the spacer layer 923 is exposed to provide a substantially flat surface for subsequent processing steps. A sealing layer 111 may be subsequently formed on the layer of energy-removable material 929.

The energy-removable material 929 may include a material such as a thermal decomposable material, a photonic decomposable material, an e-beam decomposable material, or a combination thereof. For example, the energy-removable material 929 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material.

Figure 29:
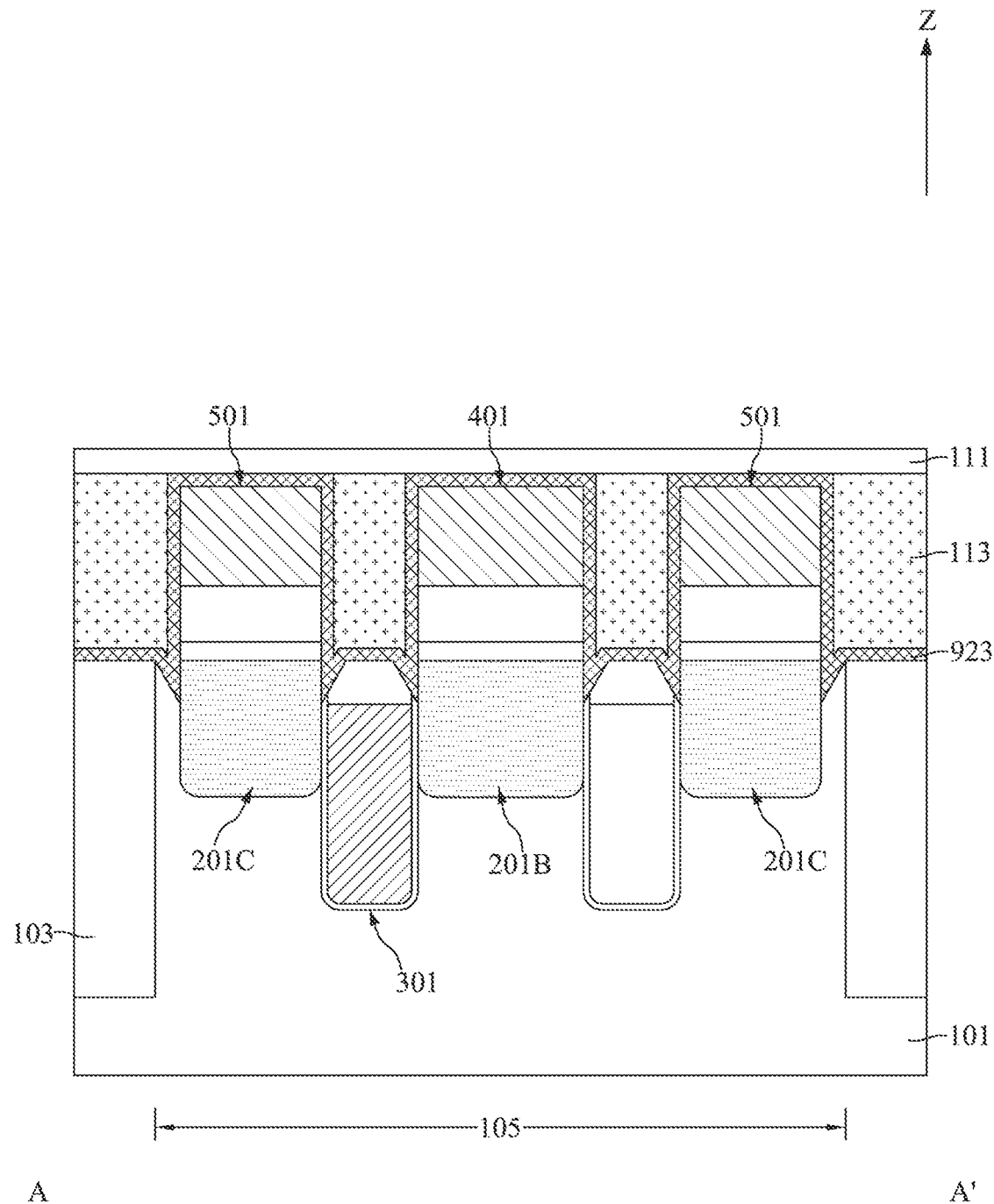

With reference to FIG. 29, an energy treatment may be performed to the intermediate semiconductor device in FIG. 28 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place.

Alternatively, in some embodiments, the base material may be silicon oxide. The decomposable porogen material may include compounds including unsaturated bonds such as double bonds or triple bonds. During the energy treatment, the unsaturated bonds of the decomposable porogen material may cross-link with silicon oxide of the base material. As a result, the decomposable porogen material may shrink and generate empty spaces, with the base material remaining in place. The empty spaces may be filled with air so that a dielectric constant of the empty spaces may be significantly low. In some embodiments, the base material may be low-k dielectric materials.

In some embodiments, the energy-removable material 929 may include a relatively high concentration of the decomposable porogen material and a relatively low concentration of the base material, but is not limited thereto. For example, the energy-removable material 929 may include about 75% or greater of the decomposable porogen material, and about 25% or less of the base material. In another example, the energy-removable material 929 may include about 95% or greater of the decomposable porogen material, and about 5% or less of the base material. In another example, the energy-removable material 929 may include about 100% of the decomposable porogen material, and no base material is used. In another example, the energy-removable material 929 may include about 45% or greater of the decomposable porogen material, and about 55% or less of the base material.

With reference to FIG. 29, after the energy treatment, the layer of the energy-removable material 929 may turn into a porous insulating layer 113. The base material may turn into a skeleton of the porous insulating layer 113 and the empty spaces may be distributed among the skeleton of the porous insulating layer 113. According to the composition of the energy-removable material 929, the porous insulating layer 113 may have a porosity of 45%, 75%, 95%, or 100%. It should be noted that, when the porosity is 100%, it means the porous insulating layer 113 includes only an empty space and the porous insulating layer 113 may be regarded as air gaps.

With reference to FIG. 29, the sealing layer 111 may be formed of, for example, a non-gap filling material such as silicon oxide formed using tetraethoxysilane (TEOS), fluorine-doped silicon oxide formed using fluorinated-TEOS, organic spin-on glass, or the like. The coverage layer 111 may be formed by chemical vapor deposition, high density plasma, spin-on, or the like. In some embodiments, the energy treatment may be performed before the formation of the sealing layer 111. In some embodiments, energy treatment may be performed after the formation of the second conductive lines 411.

Figure 30:
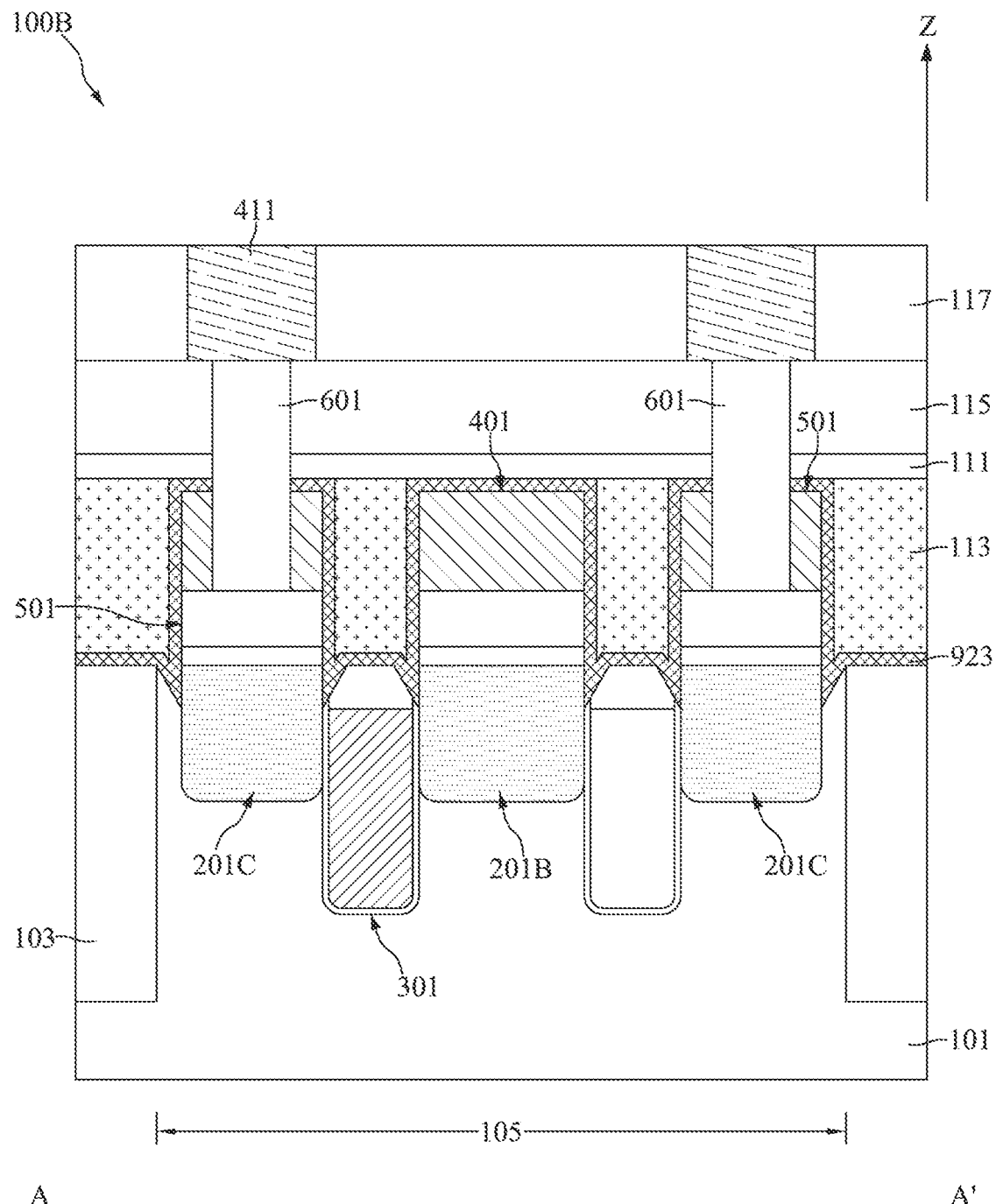

With reference to FIG. 30, the semiconductor device 100B may be provided. A third insulating layer 115 and a fourth insulating layer 117 may be sequentially formed on the sealing layer 111. The third insulating layer 115 and the fourth insulating layer 117 may be formed of a same material as the first insulating layer 107 but are not limited thereto. The second conductive lines 411 and the two top contacts 601 may be formed with a procedure similar to that illustrated in FIG. 26.

Figure 31:
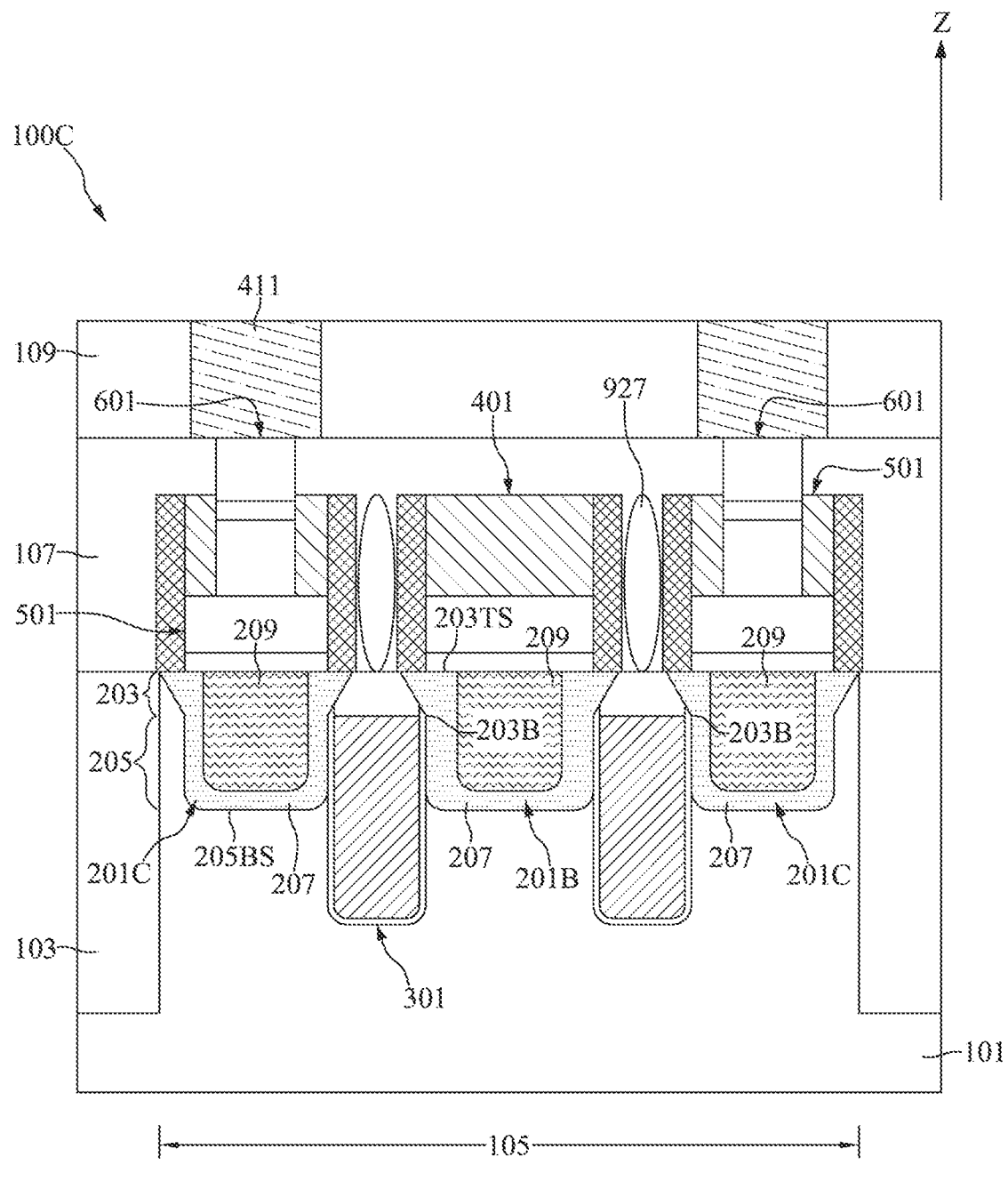

Alternatively, with reference to FIG. 31, in some embodiments, the semiconductor device 100C may be provided. An intermediate semiconductor device as illustrated in FIG. 13 may be fabricated and the plurality of impurity regions 201B, 201C may be formed in the plurality of first recesses 901 and the plurality of second recesses 903. The impurity region 201B/201C may include an outer layer 207 and an inner layer 209. The outer layer 207 may be formed on the tapering sidewalls of the first recess 901 and the sidewalls and the bottom surface 205BS of the second recess 903. The outer layer 207 may have an U-shaped cross-sectional profile and may have a recessed portion. The inner layer 209 may be formed filling the recessed portion of the outer layer 207. The dopant concentration of the outer layer 207 may be lower than the dopant concentration of the inner layer 209. The rest elements may be fabricated with a procedure similar to that illustrated in FIGS. 15 to 26.

Figure 32:
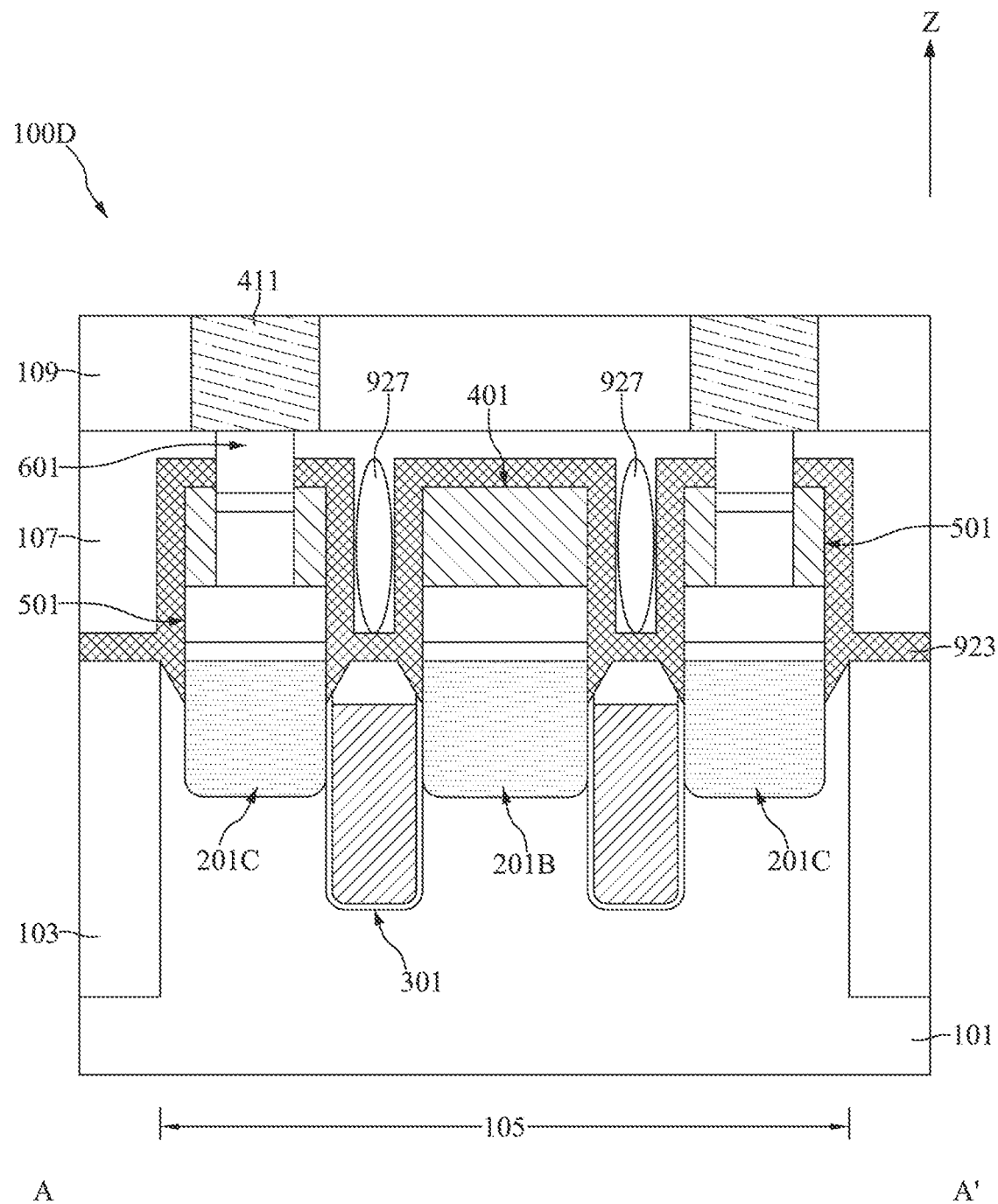

Alternatively, with reference to FIG. 32, in some embodiments, the semiconductor device 100D may be provided. An intermediate semiconductor device as illustrated in FIG. 18 may be fabricated. The first insulating layer 107 may be directly deposited over the spacer layer 923 and the plurality of air gaps 927 may be spontaneously formed between the spacer layer 923 attached on the sidewalls of the first conductive line 401 and the spacer layer 923 attached on the sidewalls of the two bottom contacts 501. The rest elements may be fabricated with a procedure similar to that illustrated in FIGS. 20 to 26.

Figure 33:
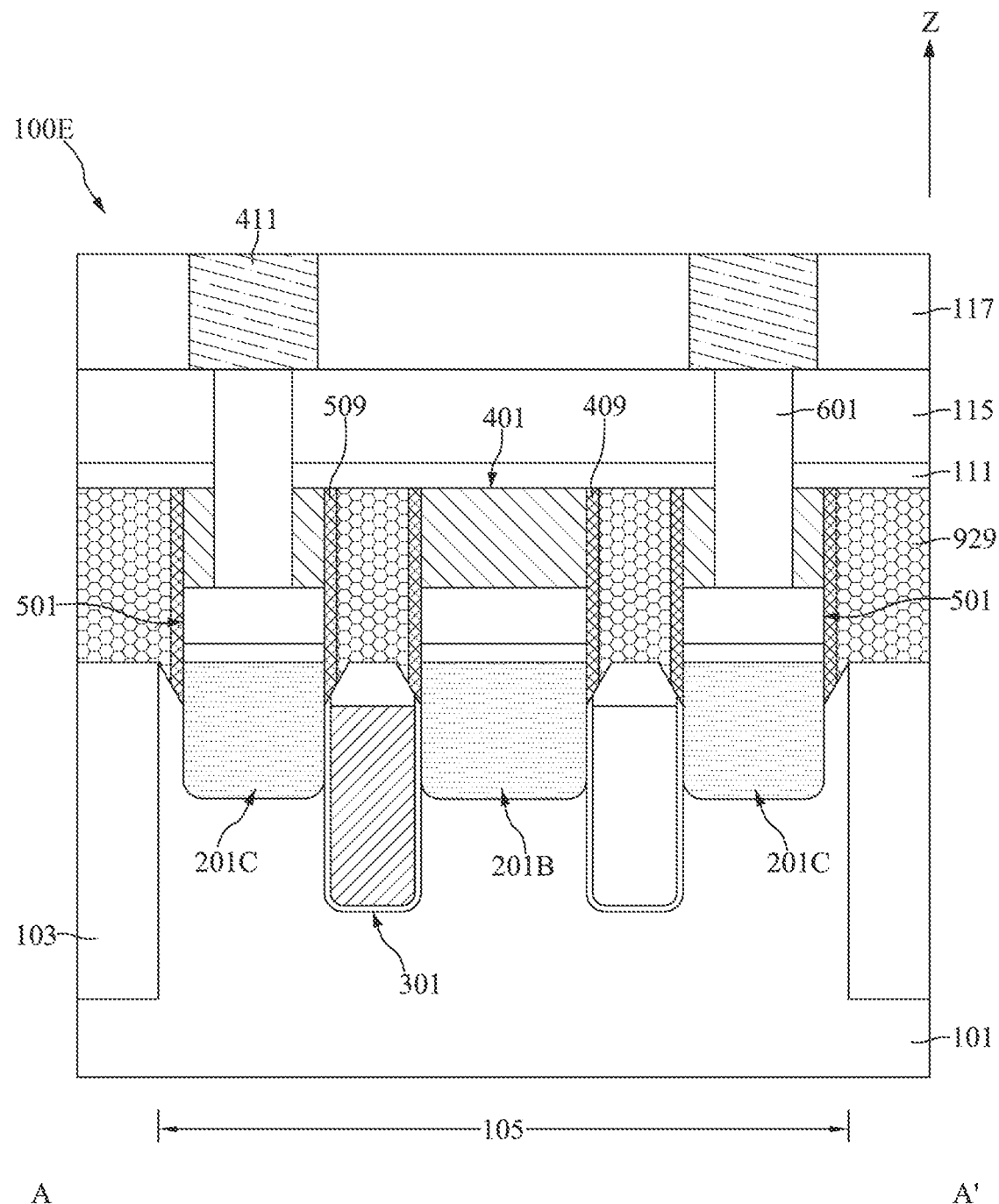

Alternatively, with reference to FIG. 33, in some embodiments, the semiconductor device 100E may be provided. An intermediate semiconductor device as illustrated in FIG. 27 may be fabricated. An etch process, such as an anisotropic dry etch process, may be performed before the deposition of the layer of energy-removable material 929 to turn the spacer layer 923 into the first conductive line spacers 409 and the bottom contact spacers 509. The layer of energy-removable material 929 (will be turned in to the porous insulating layer 113 later) may be completely fill the spaces between the first conductive line spacers 409 and the bottom contact spacers 509. The rest elements may be fabricated with a procedure similar to that illustrated in FIGS. 28 to 30.

Figure 34:
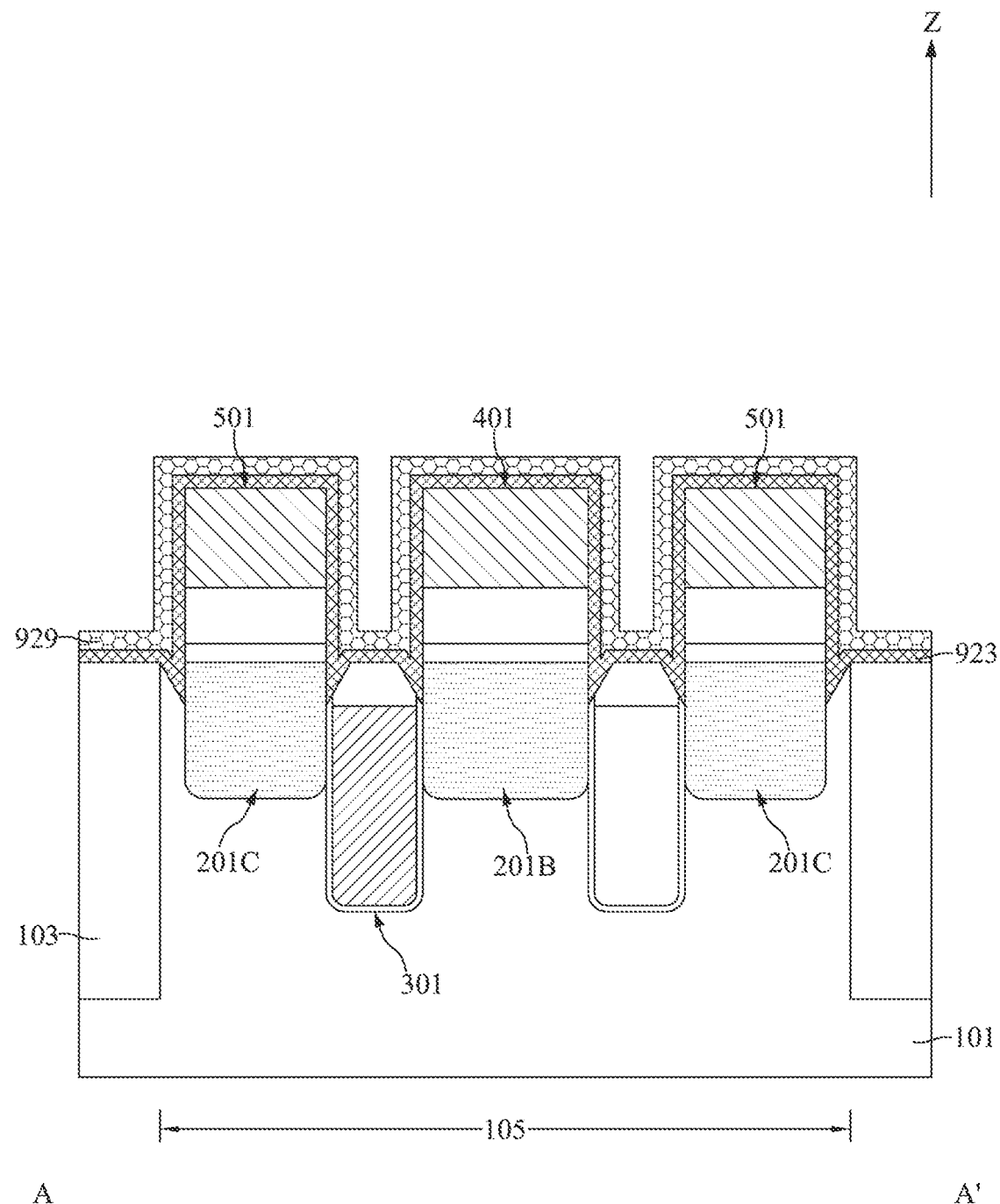

Alternatively, with reference to FIG. 34, an intermediate semiconductor device as illustrated in FIG. 27 may be fabricated. The layer of energy-removable material 929 may be formed to cover the spacer layer 923 and not completely fill the space between the spacer layer 923 attached on the sidewalls of the first conductive line 401 and the spacer layer 923 attached on the sidewalls of the two bottom contacts 501.

Figure 35:
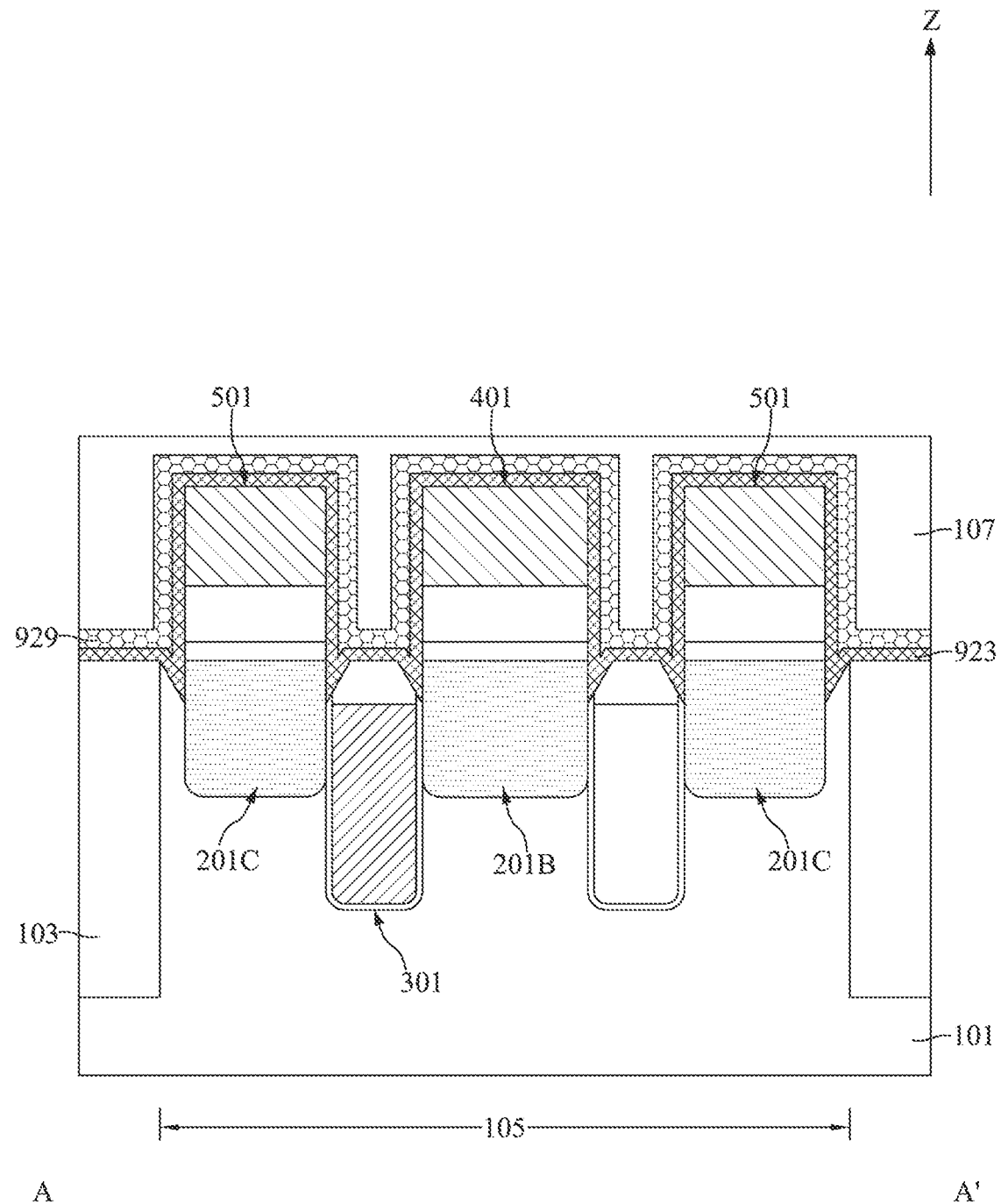

With reference to FIG. 35, the first insulating layer 107 may be formed over the intermediate semiconductor device in FIG. 34 and completely fill the spaces between the first conductive line 401 and the two bottom contacts 501. In some embodiments, the thickness of the layer of energy-removable material 929 may be too thick; hence, the first insulating layer 107 may not completely fill the spaces between the first conductive line 401 and the two bottom contacts 501. Air gaps (not shown) may be spontaneously formed between the first conductive line 401 and the two bottom contacts 501.

Figure 36:
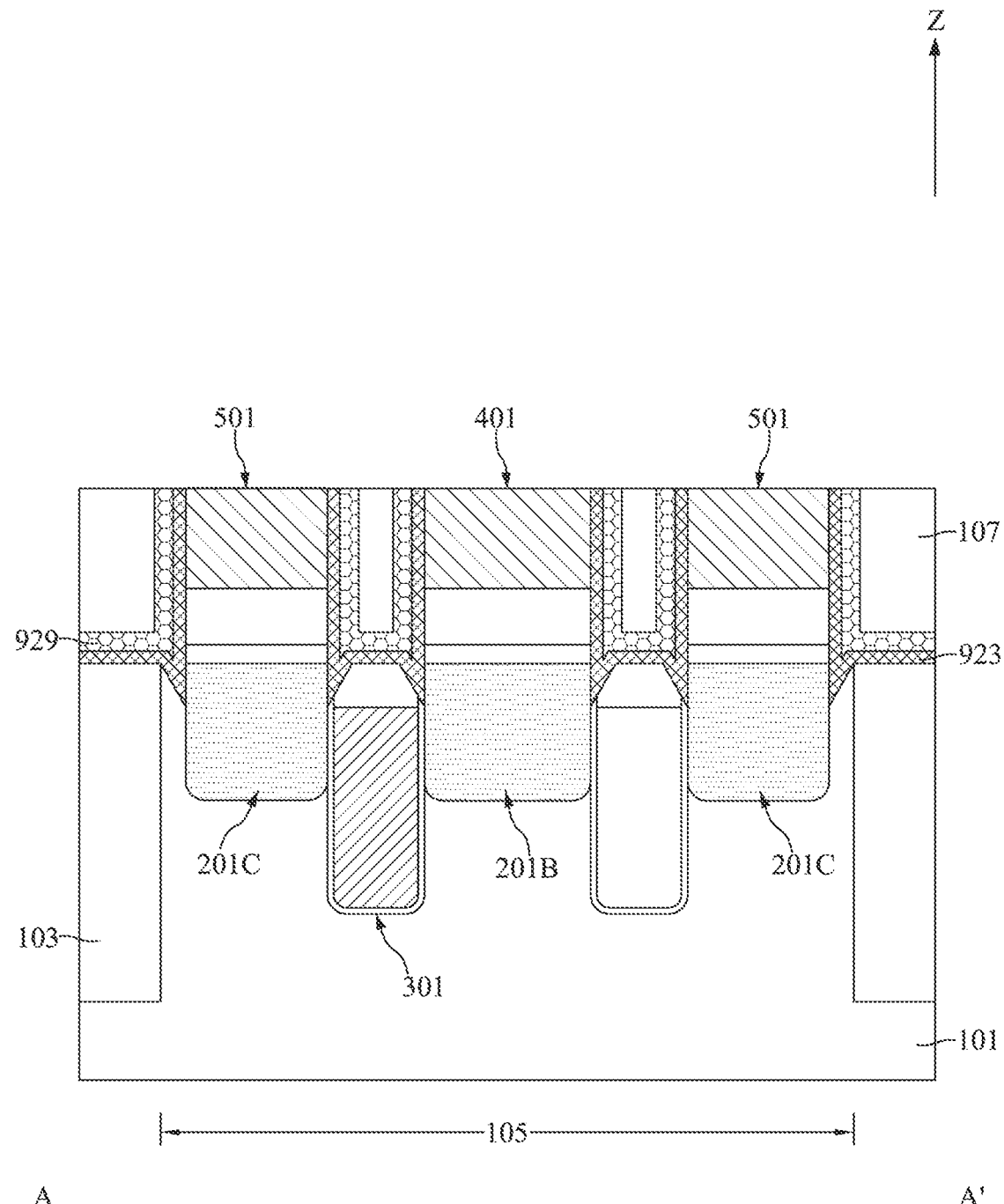

With reference to FIG. 36, a planarization process, such as chemical mechanical polishing, may be performed until the top surface of the first conductive line 401 and the two bottom contacts 501 are exposed to provide a substantially flat surface for subsequent processing steps, and separate the spacer layer 923 and the layer of energy-removable material 929 into multiple segments.

Figure 37:
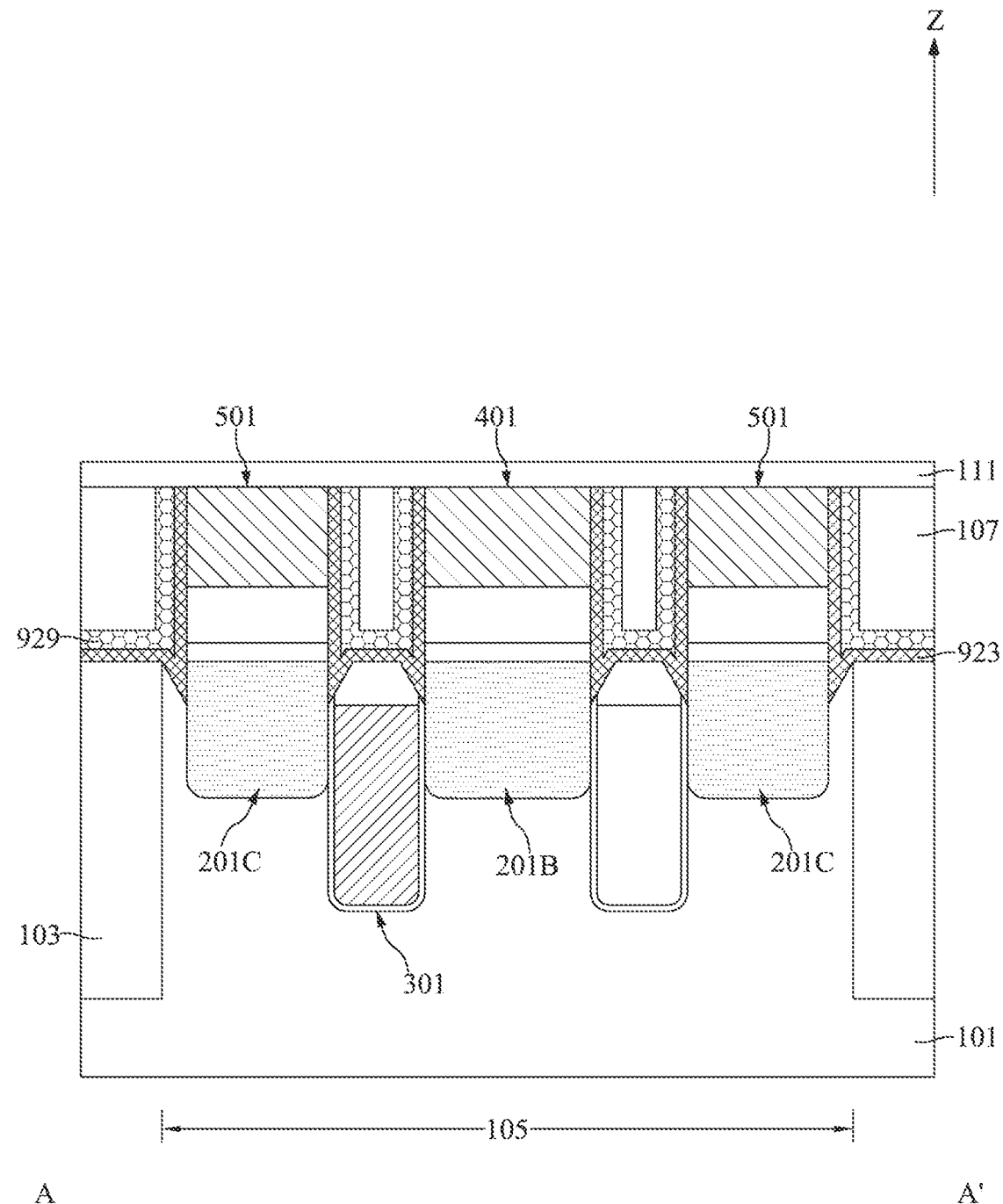
Figure 38:
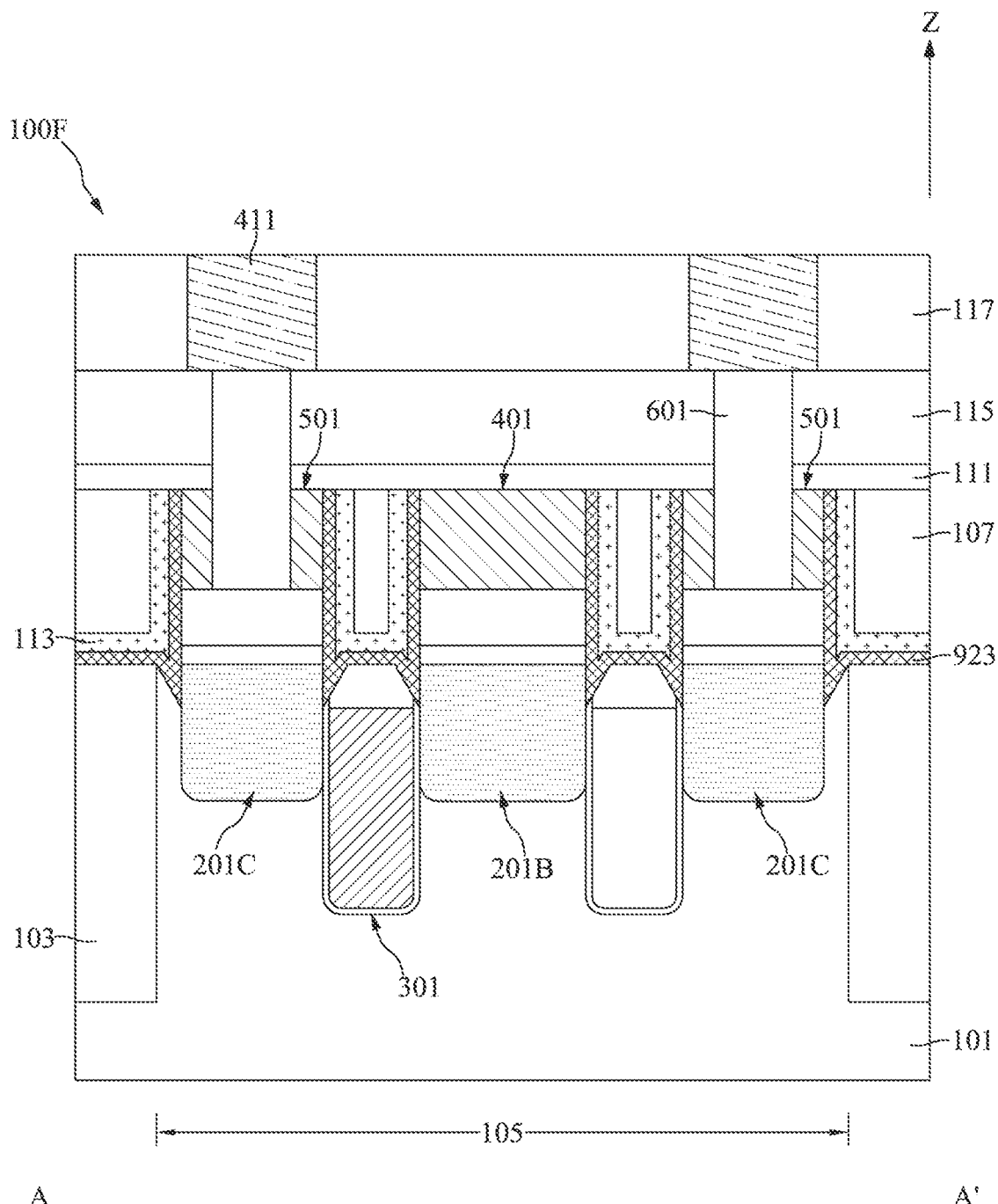

With reference to FIG. 37, the sealing layer 111 may be formed on the first insulating layer 107, the first conductive line 401, the first conductive line spacers 409, the two bottom contacts 501, the bottom contact spacers 509, the spacer layer 923, and the layer of energy-removable material 929. With reference to FIG. 38, the semiconductor device 100F may be provided. The energy treatment may be performed to the intermediate semiconductor device in FIG. 37 and turned the layer of energy-removable material 929 into the porous insulating layer 113. The porous insulating layer 113 may formed on the sidewalls of the spacer layer 923 attached on the sidewalls of the first conductive line 401 and the sidewalls of the two bottom contacts 501. The rest elements may be fabricated with a procedure similar to that illustrated in FIG. 30.

Figure 39:
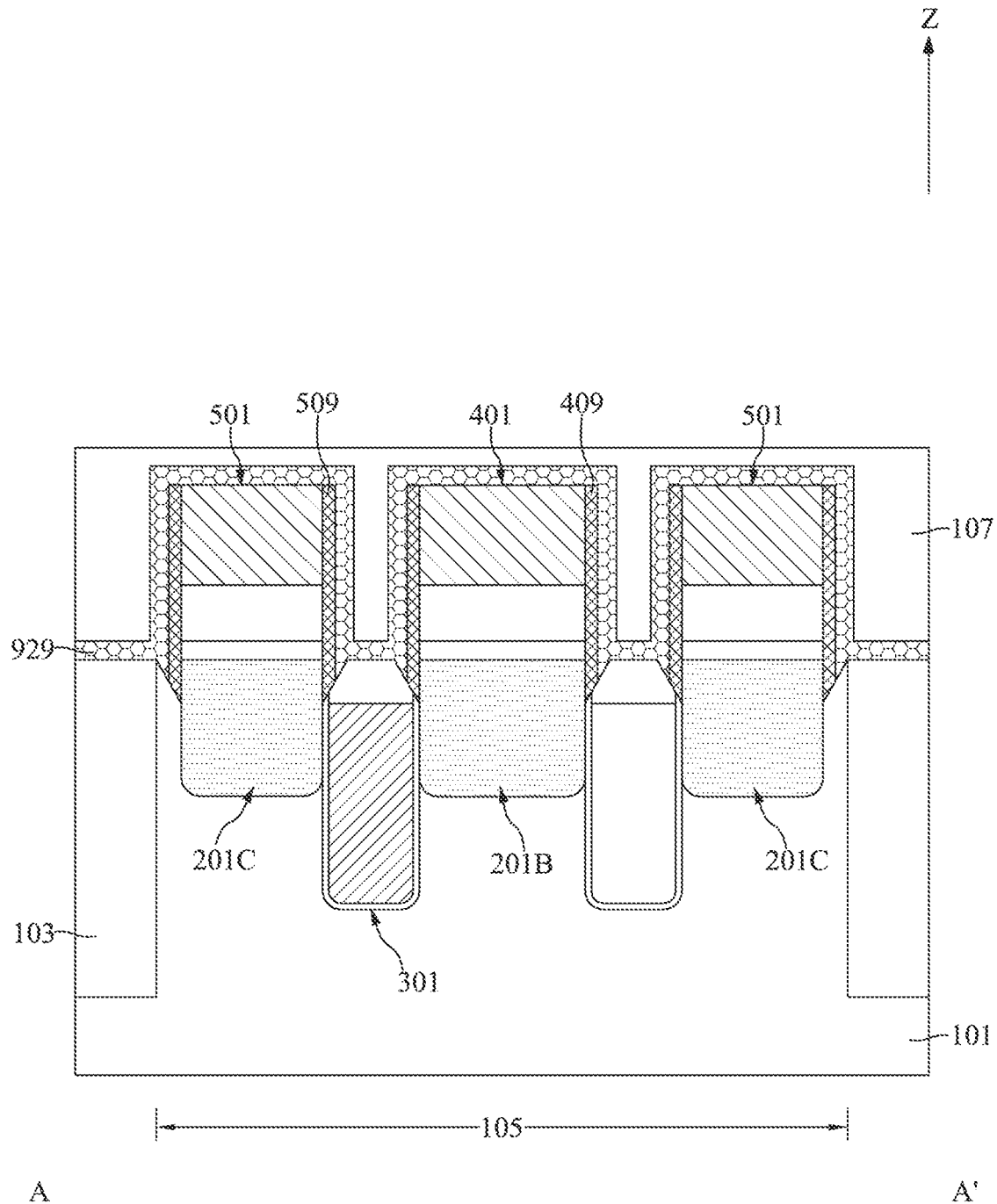
Figure 40:
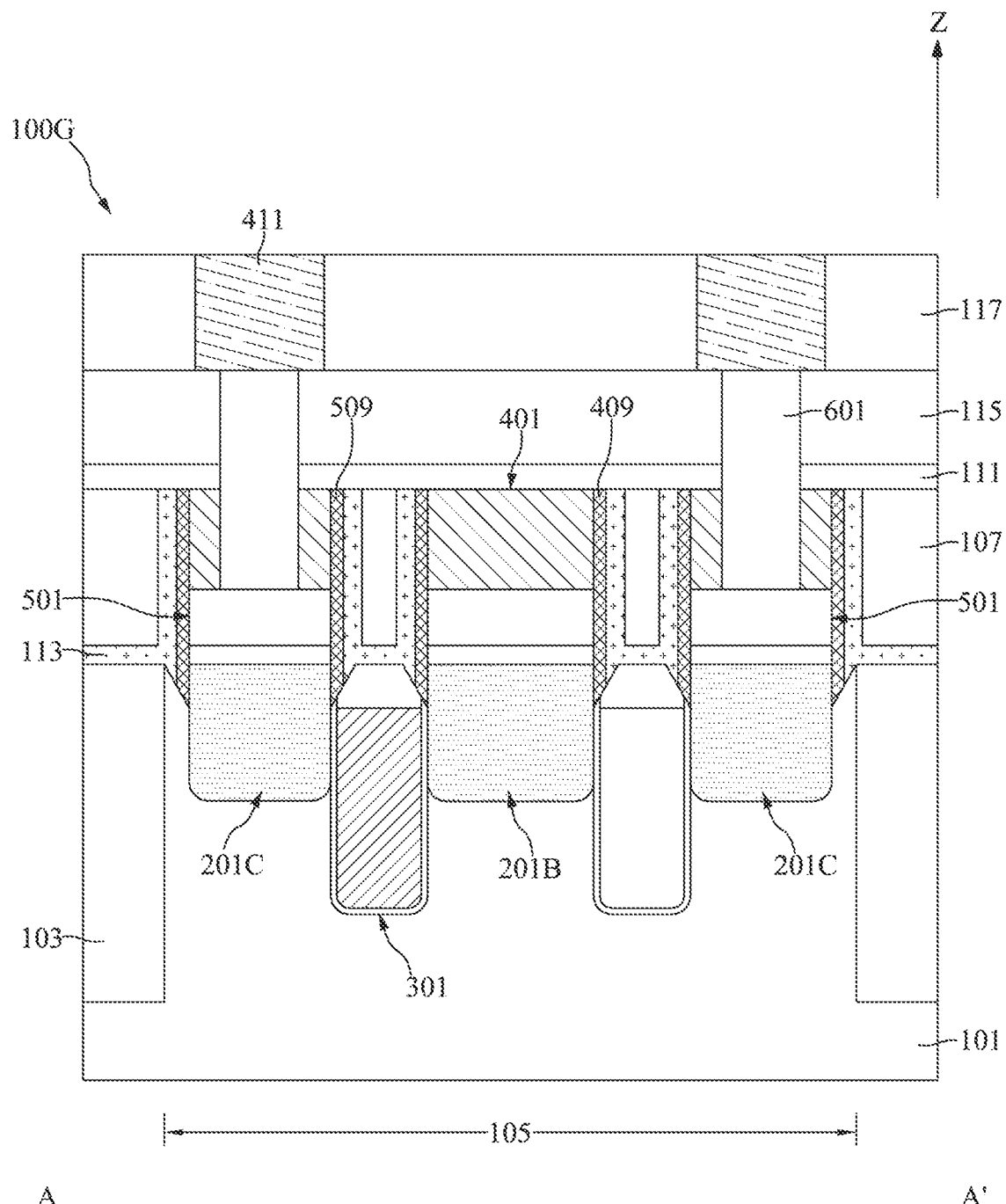

Alternatively, with reference to FIGS. 39 and 40, in some embodiments, the semiconductor device 100G may be provided. An intermediate semiconductor device as illustrated in FIG. 27 may be fabricated. An etch process, such as an anisotropic dry etch process, may be performed before the deposition of the layer of energy-removable material 929 to turn the spacer layer 923 into the first conductive line spacers 409 and the bottom contact spacers 509. After the energy treatment, the porous insulating layer 113 may be formed on sidewalls of the first conductive line spacers 409 and sidewalls of the bottom contact spacers 509. The rest elements may be fabricated with a procedure similar to that illustrated in FIG. 30.

One aspect of the present disclosure provides a semiconductor device. The semiconductor device comprises: a substrate; a first conductive line positioned on the substrate and extend along a first direction; a first conductive line spacer positioned on a sidewall of the first conductive line; a bottom contact positioned adjacent to the first conductive line; a bottom contact spacer positioned on a sidewall of the bottom contact; and a porous insulating layer positioned between the first conductive line spacer and the bottom contact spacer; wherein a porosity of the porous insulating layer is between about 25% and about 100%.

Another aspect of the present disclosure provides a method for fabricating a semiconductor device. The method comprising: providing a substrate; integrally forming a first conductive line and a bottom contact on the substrate; integrally forming a first conductive line spacer on a sidewall of the first conductive line and a bottom contact spacer on a sidewall of the bottom contact; and forming a porous insulating layer between the first conductive line spacer and the bottom contact spacer.

Due to the design of the semiconductor device of the present disclosure, the parasitic capacitance between conductive feature such as the first conductive line 401 and the two bottom contacts 501 may be reduced by the alleviation feature like the plurality of air gaps 927 or the porous insulating layer 113. Therefore, the performance of the semiconductor device may be improved. In addition, the upper portions 203 of the plurality of impurity regions 201B, 201C having tapering cross-sectional profile may provide an extra process tolerance for formation of contact thereon. Hence, the yield of fabrication of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   integrally forming a first conductive line and a bottom contact on the substrate;
   integrally forming a first conductive line spacer on a sidewall of the first conductive line and a bottom contact spacer on a sidewall of the bottom contact;
   forming a porous insulating layer between the first conductive line spacer and the bottom contact spacer; and forming two impurity regions in the substrate and below the first conductive line and the bottom contact, wherein the two impurity regions are formed of silicon phosphide, phosphorus-doped silicon carbon, silicon carbide, silicon germanium, silicon-germanium-tin alloy, or silicon-germanium-boron alloy.

2. The method for fabricating the semiconductor device of claim 1, wherein a porosity of the porous insulating layer is between about 25% and about 100%.

3. The method for fabricating the semiconductor device of claim 1, wherein a distance between the first conductive line spacer and the bottom contact spacer is less than one-fourth of a line width of the first conductive line.

4. The method for fabricating the semiconductor device of claim 1, wherein a sum of a thickness of the first conductive line spacer and a thickness of the bottom contact spacer is equal to or greater than one-half of a distance between the first conductive line and the bottom contact.

5. The method for fabricating the semiconductor device of claim 4, further comprising a word line structure positioned between the two impurity regions.

6. The method for fabricating the semiconductor device of claim 5, wherein each of the two impurity regions comprises an upper portion positioned adjacent to the word line structure and a lower portion positioned below the upper portion and the upper portion has a tapering cross-sectional profile.

7. The method for fabricating the semiconductor device of claim 6, wherein the upper portion of each of the two impurity regions comprises a top surface substantially coplanar with a top surface of the substrate and two tapering sidewalls connected to the top surface and an angle between one of the two tapering sidewalls and the top surface is between about 45 degrees and about 60 degrees.

8. The method for fabricating the semiconductor device of claim 7, wherein the word line structure comprises a word line dielectric layer contacting the lower portion of the impurity region, a word line electrode positioned on the word line dielectric layer, and a word line capping layer positioned on the word line electrode.

9. The method for fabricating the semiconductor device of claim 8, wherein the bottom contact comprises a bottom contact barrier layer and a bottom contact conductive layer positioned on the bottom contact barrier layer, the bottom contact spacer is positioned on a sidewall of the bottom contact barrier layer and a sidewall of the bottom contact conductive layer.

10. The method for fabricating the semiconductor device of claim 9, wherein the bottom contact conductive layer is a stacked layer comprising a bottom layer formed of tungsten nitride and a top layer formed of tungsten.

11. The method for fabricating the semiconductor device of claim 10, further comprising a top contact positioned between the bottom contact and the second conductive line.

12. The method for fabricating the semiconductor device of claim 11, wherein the first conductive layer is formed of doped polysilicon, the second conductive layer is formed of metal silicide and has a thickness between about 2 nm and about 20 nm, and the third conductive layer is formed of metal or metal nitride.

13. The method for fabricating the semiconductor device of claim 6, wherein a thickness of the upper portion of each of the two impurity regions is equal to or less than one-fifth of a thickness of each of the two impurity regions.

14. The method for fabricating the semiconductor device of claim 13, wherein the word line dielectric layer has a thickness between about 10 angstroms and about 30 angstroms.

15. The method for fabricating the semiconductor device of claim 14, wherein the bottom contact barrier layer is a stacked layer comprising a bottom layer formed of titanium and a top layer formed of titanium nitride.

16. The method for fabricating the semiconductor device of claim 1, further comprising a second conductive line positioned above the bottom contact and extend along a second direction different from the first direction.

17. The method for fabricating the semiconductor device of claim 16, wherein the top contact comprises a first conductive layer positioned on the bottom contact, a second conductive layer positioned on the first conductive layer, and a third conductive layer positioned on the second conductive layer.

18. The method for fabricating the semiconductor device of claim 17, wherein the porous insulating layer is positioned on a sidewall of the first conductive line spacer and a sidewall of the bottom contact spacer.

* * * * *